United States Patent [19]

Ito

[11] Patent Number: 5,409,789
[45] Date of Patent: Apr. 25, 1995

[54] EXPOSURE MASK COMPRISING TRANSLUCENT AND TRANSPARENT PHASE SHIFTERS

[75] Inventor: Shin-ichi Ito, Yokohama, Japan

[73] Assignee: Kabushiki Kaisha Toshiba, Tokyo, Japan

[21] Appl. No.: 91,357

[22] Filed: Jul. 15, 1993

[30] Foreign Application Priority Data

Jul. 17, 1992 [JP] Japan .................................. 4-191065
Sep. 25, 1992 [JP] Japan .................................. 4-256779
May 25, 1993 [JP] Japan .................................. 5-122815

[51] Int. Cl.[6] .............................................. G03F 9/00
[52] U.S. Cl. ......................................... 430/5; 430/321
[58] Field of Search ............................ 430/5, 321, 311

[56] References Cited

FOREIGN PATENT DOCUMENTS 3-156459 7/1991 Japan .
3-267940 11/1991 Japan .
4-76550 3/1992 Japan .

*Primary Examiner*—S. Rosasco
*Attorney, Agent, or Firm*—Finnegan, Henderson, Farabow, Garrett & Dunner

[57] ABSTRACT

This invention provides an exposure mask having mask patterns formed on a transparent substrate, the mask patterns including translucent phase shift patterns having a light path length for exposure light differentiated by 180° from that of transparent areas of said transparent substrate and transparent phase shift patterns. Such an exposure mask can be advantageously used to realize highly defined patterns.

20 Claims, 16 Drawing Sheets

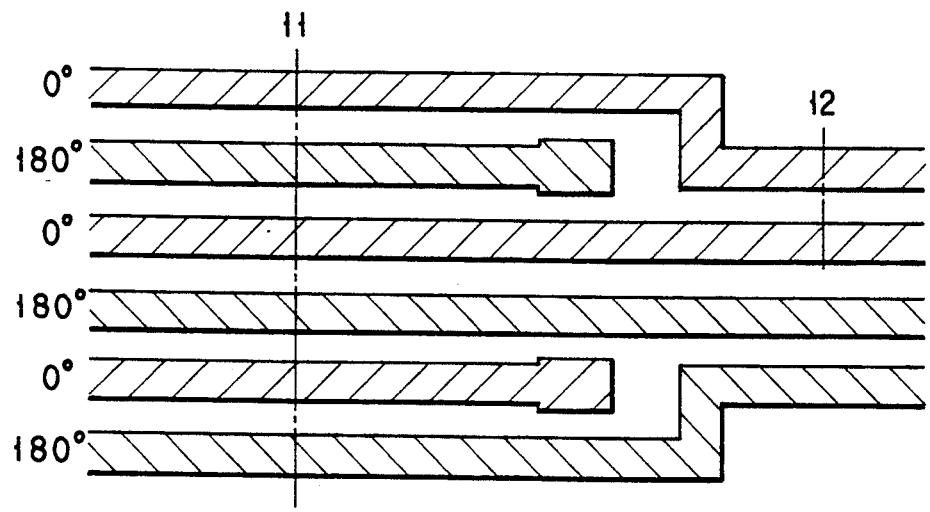
F I G. 1
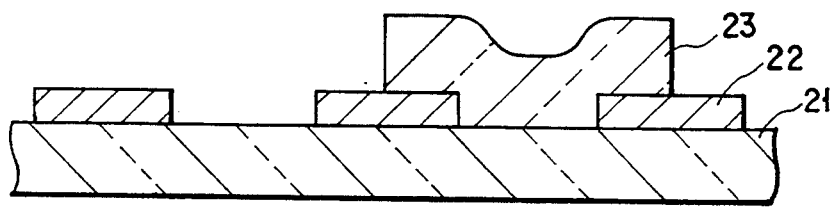
F I G. 2A
(PRIOR ART)
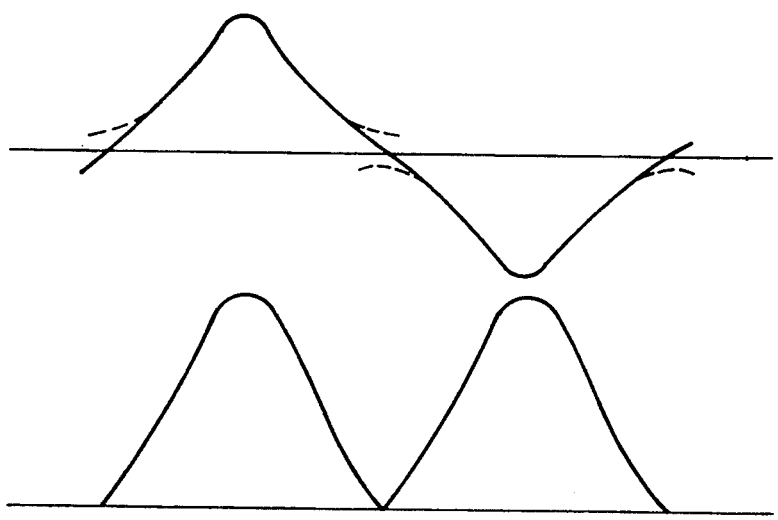
F I G. 2B
(PRIOR ART)
F I G. 2C
(PRIOR ART)

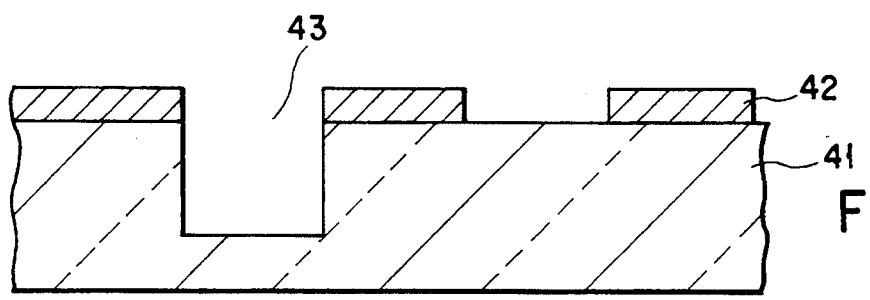
F I G. 4A
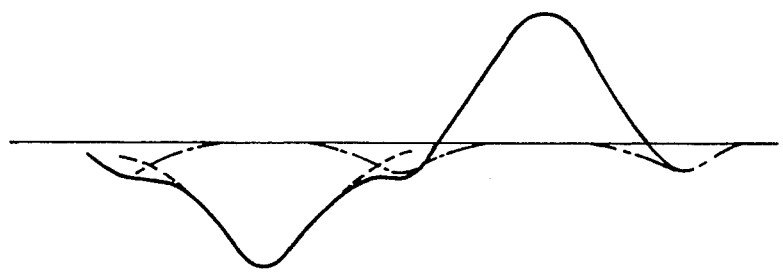
F I G. 4B
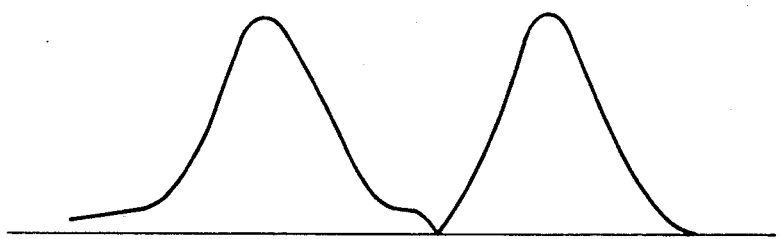
F I G. 4C

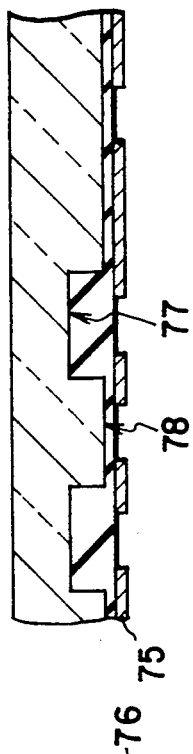
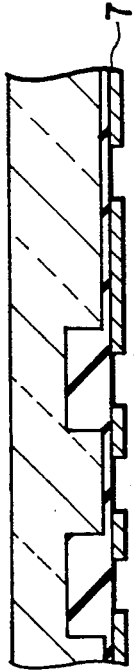
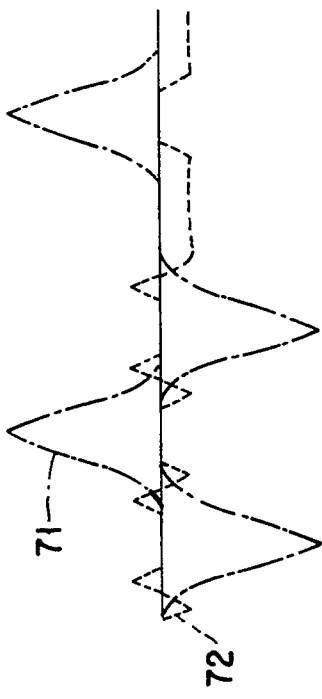
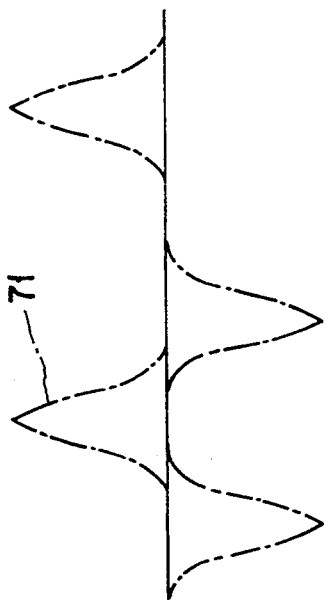
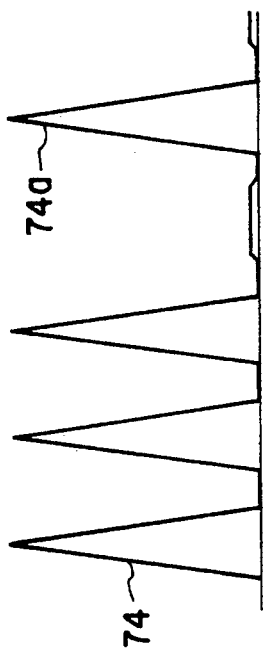
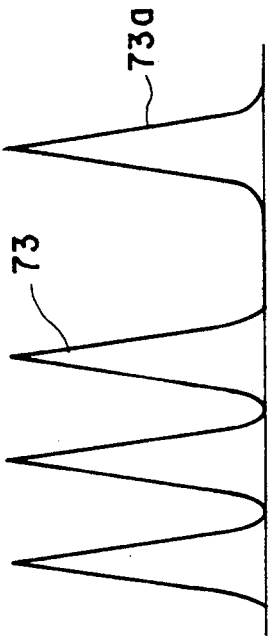
FIG. 7A  FIG. 7B  FIG. 7C

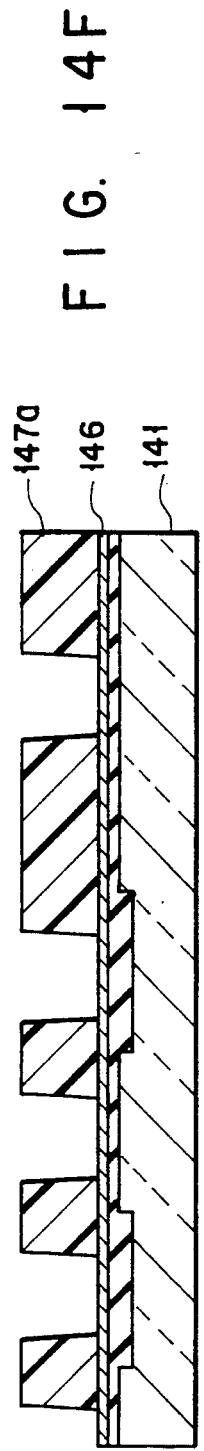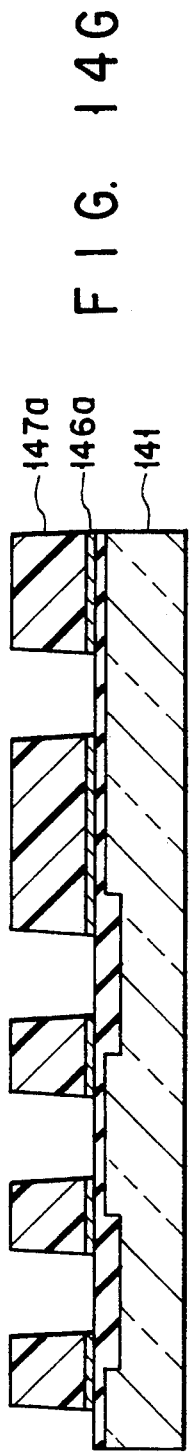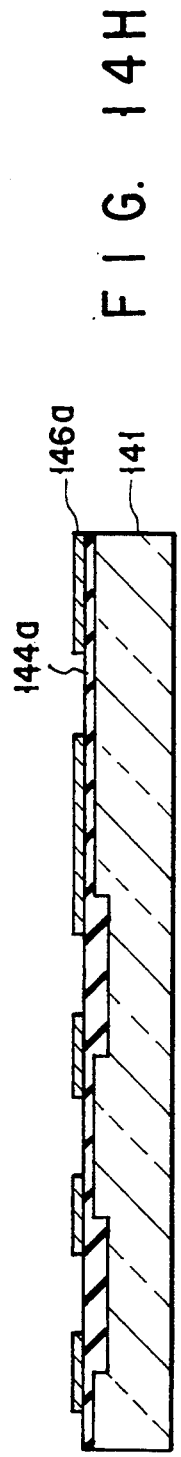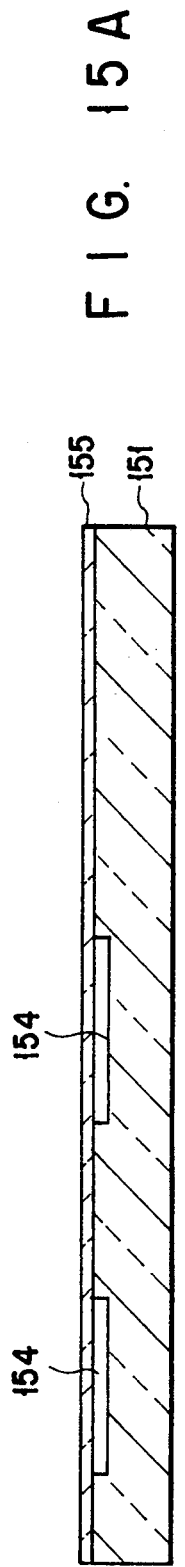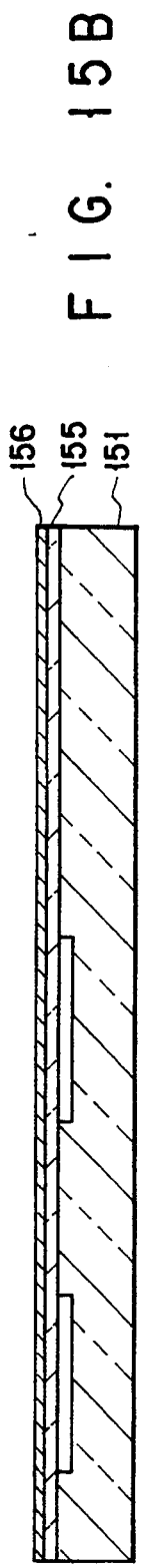

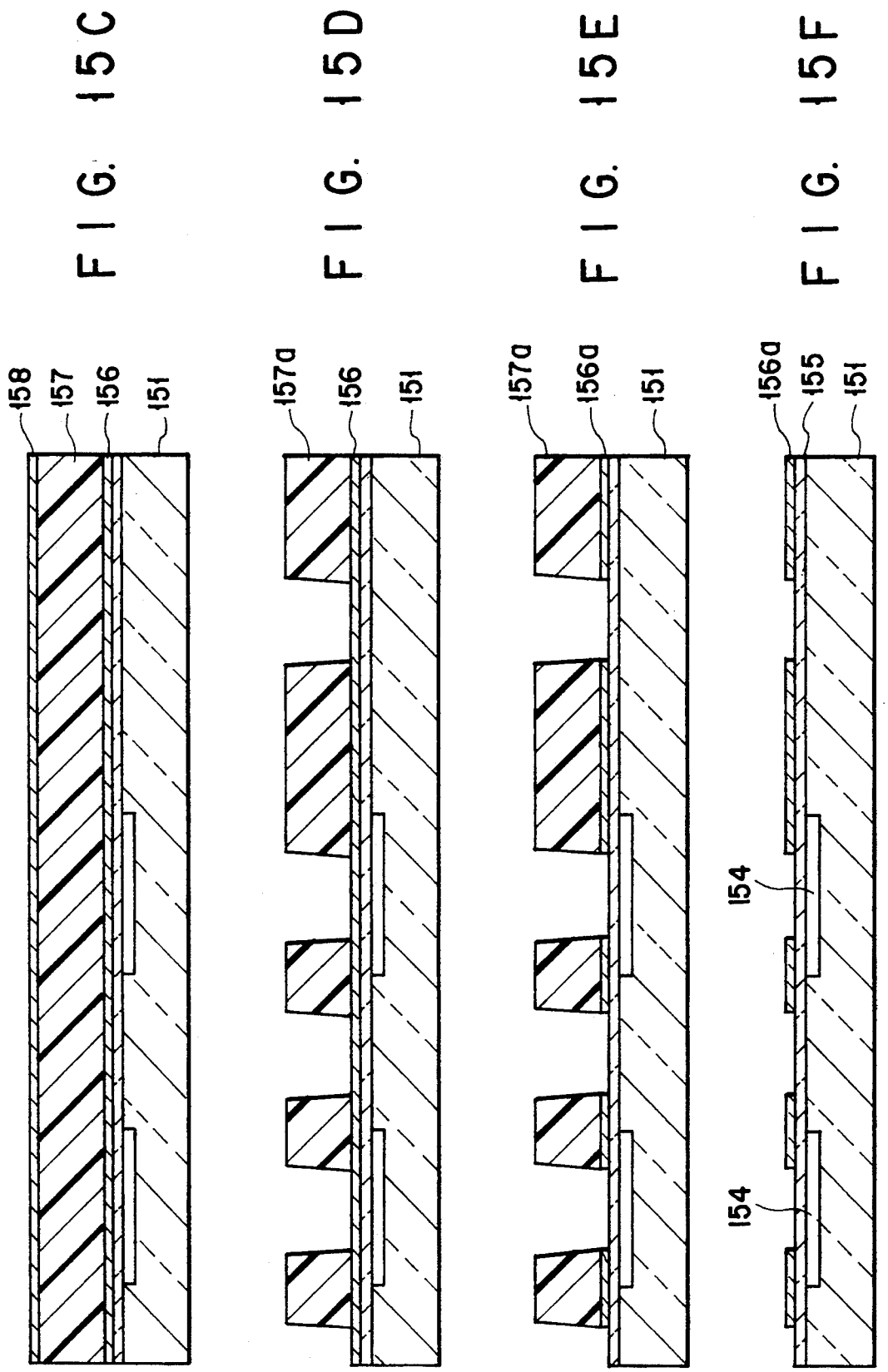

EXPOSURE MASK COMPRISING TRANSLUCENT AND TRANSPARENT PHASE SHIFTERS

BACKGROUND OF THE INVENTION

1. Field of the Invention

The invention relates to a mask for projection exposure to be used for lithographic process in manufacturing semiconductor devices. Still more particularly, the invention relates to a mask for exposure using a phase shifter in order to improve the resolution.

2. Description of the Related Art

Fast functioning and high integration are two remarkable features of semiconductor devices developed in recent years. Finely defined precision patterns are required for pattern exposure systems in the production of semiconductor devices having these features and rays of light having a short wavelength such as far ultraviolet rays of light are widely used for light sources that are compatible with such patterns.

However, while an increased use of KrF excimer laser involving beams oscillating at a wavelength as short as 248 nm is expected for the light source of pattern exposure systems, there have not been developed any resists that can be effectively used with laser beams. Existing resists originally designed for use with g, i lines and electron beams are among inevitable alternatives that are currently available. Resists to be used for g and i lines are based on novolac resin having a large absorption coefficient for beams with a wavelength of 248 nm and, therefore, when KrF excimer laser beams are irradiated onto a surface of a resist film of this type, they are mostly absorbed by the film as they pass there without reaching the other side. Consequently, only a surface of the resist film is exposed to laser beam. Therefore, it is difficult to prepare a pattern having a large aspect ratio by using a resist for use with g or i lines.

A finely defined pattern may be formed by directly projecting electron beams on a resist film. However, this method of forming a pattern is accompanied by problems involving resist-heating, charging-up and the through-put of pattern production and, therefore, not suited for the production of patterns on a large scale. On the other hand, while the use of radioactive rays such as X-rays, electron beams or electrically charged corpuscular beams such as ion beams for producing patterns may be promising in terms of high resolution, aligners and resists that can be used with any of the above mentioned beams are still to be developed.

In short, any attempts to produce finely defined patterns by using unusual light sources face problems that may not be resolved easily. In view of this fact, efforts have been made recently to provide finely defined patterns by combining a conventional light source and a newly devised technique. One of such newly developed techniques is a phase shift method, with which a phase inverting layer is provided in areas of a resist film where rays of light are allowed to pass in order to prevent adverse effects of diffracted rays of light coming from adjacent patterns and thereby improve the fineness of the projected pattern.

Of variations of the phase shift method, a so called Levenson-type phase shift method utilizes a number of phase shifters arranged in an alternate manner in light transmission zones of a mask provided with opaque patterns. The phase of rays of light that have passed the phase shifters of the mask is inverted or shifted by 180° relative to that of their counterparts that have passed through the areas of the mask where no phase sifters are disposed. In short, this method reduces interference of rays of light coming from adjacent patterns to enhance the resolution of the projected pattern by inverting the phase of rays of light passing through areas of the mask disposed adjacent to patterns.

Another variation of the phase shift method utilizes a phenomenon where dark areas are generated near the edges of a phase shifter. This technique can produce a very steep gradient in the intensity of projected light so that a finely defined space pattern may be formed when a negative type resist is used for wafer manufacturing processes. For instance, grooves having a width as small as 250 nm may be formed by using light beams having a wavelength of 365 nm for pattern alignment.

However, the above described phase shift method is not without problems. For one thing, while a Levenson-type phase shift mask shows an excellent resolution, it is subject to rigorous restrictions in terms of pattern arrangement. If a mask under consideration has a pattern arrangement as illustrated in FIG. 1 of the accompanying drawings, it may be understood that the phases of two adjacent patterns of the mask are inverted or shifted by 180° relative to each other along broken line 11 but close to each other along broken line 12. Thus, such a mask may not be particularly excellent in resolution at locations where patterns show phases that are close to each other.

On the other hand, if the technique of utilizing dark areas generated near the edges of a phase shifter can effectively provide finely defined patterns, it cannot form large patterns. In other words, large patterns can be prepared only by using conventional opaque patterns. Therefore, while finely defined patterns may be produced for a phase shift mask by utilizing phase shifters, such a mask may not be able to operate satisfactorily because patterns having a large area of the mask are inevitably conventional light screen patterns having a relatively poor resolution.

Thus, on the one hand, a conventional Levenson-type phase shift mask is accompanied by a disadvantage that adjacent patterns can have phases that are identical with each other to the detriment of the achievable resolution. On the other hand, the technique of utilizing dark areas near the edges of a phase shifter does not address the problem of improving the resolution of a mask in the areas of the large patterns it comprises.

SUMMARY OF THE INVENTION

In view of the above described circumstances, it is therefore an object of the present invention to provide an exposure mask capable of producing a phase shift effect in areas of the mask where adjacent patterns have phases identical to each other and large patterns are disposed in order to enhance the overall resolution of the mask.

According to a first aspect of the present invention, the above object is achieved by providing an exposure mask comprising mask patterns arranged on a light transmitting substrate characterized in that said mask patterns are constituted by translucent phase shift patterns arranged on unexposed areas of the substrate and transparent phase shift patterns arranged on exposed areas of the substrate, said translucent phase shift patterns having a phase shifted by a given extent from that of transparent phase shift patterns.

According to a second aspect of the invention, there is provided an exposure mask comprising translucent phase shift patterns and transparent phase shift patterns characterized in that the phase shift patterns show a double layer structure at and near the edges of each of them and that each of said translucent phase shift patterns is laid on one of said transparent phase shift patterns at an edge thereof.

According to a third aspect of the invention, there is provided an exposure mask characterized in that it comprises a transparent substrate capable of transmitting exposure light, transparent phase shift areas formed by burying a material showing a refractive index different from that of the substrate relative to exposure light on a surface of or inside the transparent substrate in such as manner that the areas does not disturb the planar surface of the substrate and translucent phase shift patterns formed on respective planarized areas of the transparent substrate so as to cover the boundaries of the transparent phase shift areas.

According to a fourth aspect of the invention, there is provided an exposure mask characterized in that it comprises a transparent substrate capable of transmitting exposure light, transparent phase shift areas formed by engraving part of the surface of the transparent substrate and providing light paths differentiated from the corresponding light paths of the substrate with regard to the wavelength of exposure light, a transparent plate formed on the transparent substrate to completely close the transparent phase shift areas and translucent phase shift patterns formed on the transparent plate so as to cover the boundaries of the transparent phase shift areas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic partial view of a conventional exposure mask comprising patterns provided with a phase shifter and those with no phase shifter;

FIG. 2A is a schematic sectional partial view of a conventional Levenson-type mask;

FIG. 2B is a graph showing the light amplitude distribution of the Levenson-type mask of FIG. 2A;

FIG. 2C is a graph showing the light intensity distribution of the Levenson-type mask of FIG. 2A;

FIG. 4A is a schematic sectional partial view of a Levenson and half tone-type mask according to the invention realized by engraving a transparent substrate to form transparent phase shift patterns;

FIG. 4B is a graph showing the light amplitude distribution of the Levenson and half tone-type mask of FIG. 4A;

FIG. 4C is a graph showing the light intensity distribution of the Levenson and half tone-type mask of FIG. 4A;

FIGS. 7A through 7C are views illustrating for comparing a conventional Levenson and half tone-type mask and a mask according to the third and fourth aspects of the invention;

FIGS. 14A through 14H are sectional views of an exposure mask according to the invention used in Example 13 as described hereinafter, showing steps for preparing it; and FIGS. 15A through 15F are sectional views of an exposure mask according to the invention used in Example 15 as described hereinafter, showing steps for preparing it.

DETAILED DESCRIPTION OF THE PREFERRED EMBODIMENTS

Figure 3A:
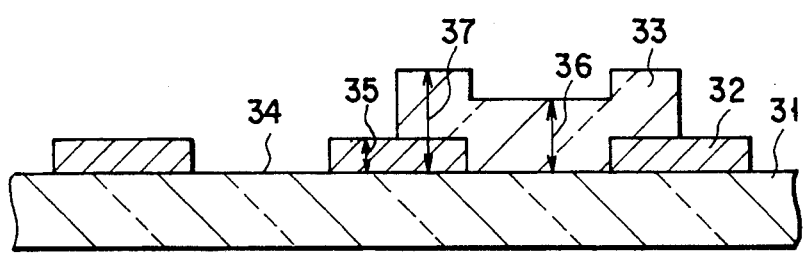
FIGS. 3A, 5A, 6A and 6D are schematic sectional partial views of different Levenson and half tone (Attenuated)-type masks according to the invention.

A principal objective of the present invention is to provide patterns such as isolated trimmed patterns and contact hole patterns with a phase shift effect by using translucent phase shift films in place of opaque films.

Some of the advantageous features of an exposure mask according to the present invention include the following.

(1) The phase shift areas have a phase shifted by $(90 \times m) \pm 10°$ or $(120 \times n) \pm 10°$ (where m and n are integers equal to or greater than 1) from that of the remaining areas.

(2) The translucent phase shift patterns have a phase shifted by $\{180 \times (2L+1)\} \pm 10°$ (where L is an integer) from that of exposure light passing through the related alignment media having the same thickness.

(3) The entire exposure area of the transparent substrate is covered by a material having a refractive index different from that of the substrate to form a film having a thickness of h.

(4) The film thickness h is so determined that the intensity of light passing through the phase shift areas is equal to that of light passing through the areas other than the phase shift areas after multiple reflections.

(5) The translucent phase shift patterns have an amplitude transmissivity of 20±15% relative to exposure light passing through the related exposure media having the same thickness.

(6) Each of the translucent phase shift patterns comprises a single translucent film layer or a multilayer structure having a translucent film layer and a transparent film layer.

(7) An opaque film having an amplitude transmissivity of not greater than 5% is disposed along the boundary of any exposure area and an adjacent unexposure area of the mask.

An exposure mask according to the invention may preferably be prepared by either of the following methods.

(1) A method comprising steps of engraving a recessed pattern on part of a transparent substrate, subsequently forming transparent phase shift areas by depositing a transparent material showing a refractive index different from that of the transparent substrate relative to exposure light at least on the recessed pattern, thereafter smoothing surface areas of the substrate including those for printing, then forming a translucent phase shift film on at least part of the smoothed areas of the substrate and partly removing the translucent phase shift film in such a manner that the translucent phase shift film may partly remain along the boundaries of the transparent phase shift areas.

(2) A method comprising steps of engraving a recessed pattern on part of a transparent substrate, subsequently forming transparent phase shift areas by arranging a transparent plate on the substrate and planarizing the surface of the substrate, then forming a translucent phase shift film on the entire surface or a part of the surface of the transparent plate and partly removing the translucent phase shift film in such a manner that the translucent phase shift film may at least partly remain along the boundaries of the transparent phase shift areas.

Preferably the step of planarizing the surface of the substrate including the boundaries of the transparent phase shift areas comprises an operation of removing by polishing any projections that may be found on the surface of the substrate. Still preferably, the step of planarizing the surface of the substrate including the boundaries of the transparent phase shift areas comprises an operation of applying a fluid material on the surface of the substrate, smoothing the surface and thereafter removing projections that may be found on the surface by unselective etching (etching performed under a condition which an etching rate of the substrate is equal to that of the fluid material).

Preferably, the surface of the translucent transparent patterns is forcibly oxidized. Still preferably, the above methods further comprise a step of forming an opaque film instead of a translucent phase shift film. Still preferably, each of the boundaries of the transparent phase shift areas forms at least partly an equidistant line with regard to adjacent two edges of the related translucent phase shift patterns or opaque films.

Some of the characteristic features of an exposure mask according to the invention will be described below.

FIG. 2A is a schematic sectional partial view of a conventional Levenson-type exposure mask.

Opaque patterns 22 are arranged on the surface of a transparent substrate 21 and a transparent phase shift pattern 23 is formed on each transparent area separating two adjacent opaque patterns 22 in such a manner that it partly covers the opaque patterns 22. The amplitude of light passing through the mask will show a distribution curve as illustrated in FIG. 2B. FIG. 2C is a distribution curve of the intensity of light at the bottom of the mask, representing the resolution of the mask. In an exposure mask according to the invention, the opaque patterns of a Levenson-type mask are replaced by translucent phase shift patterns. In other words, an exposure mask according to the invention is realized by coordinating a Levenson-type mask and a half-tone-type mask. With such an arrangement, the resolution of any adjacent transparent areas having an identical phase will be improved by the phase shift effect of the translucent areas and hence the depth of focus of the mask will be increased.

FIG. 3A is a schematic sectional partial view of a mask according to the invention, which is an improved Levenson-type mask where translucent phase shift patterns and transparent phase shift patterns formed by anisotropic deposition are arranged in a coordinated manner. This mask is realized by arranging translucent phase shift patterns 32 that correspond to areas not exposed to light irradiation of a wafer (unexposed areas) on a transparent substrate 31 and forming a transparent phase shift pattern 33 on each transparent area separating two adjacent translucent phase shift patterns 32 in such a manner that the transparent pattern 33 partly covers the translucent patterns 32. The translucent phase shift patterns 32 and the transparent phase shift patterns 33 have a phase shifted by 180° relative to that of the substrate 31.

Now, when the phase of light passing through each of the areas of the mask is observed, assuming that the rays of light that have passed through exposed areas of the substrate 31 have a phase of-0°, the rays of light that have passed through the areas 35 carrying only a translucent phase shift pattern 32 and those that have passed through the areas 36 carrying only a transparent phase shift pattern will show a phase shifted by 180° from that of the above described rays of light. On the other hand, the rays of light that have passed through the areas 37 carrying both a translucent phase shift pattern 32 and a transparent phase shift pattern 33 as a double layer structure will show a phase shifted by 180° multiplied by two, or 360°.

Thus, if no phase shifter is arranged on either of two adjacent transparent sections or a phase shifter is disposed on both of two adjacent transparent sections, the phases of the rays of light that have passed through adjacent light paths (34–35, 35–37, 37–36) will always show a shift of 180° relative to each other.

Figure 3B:
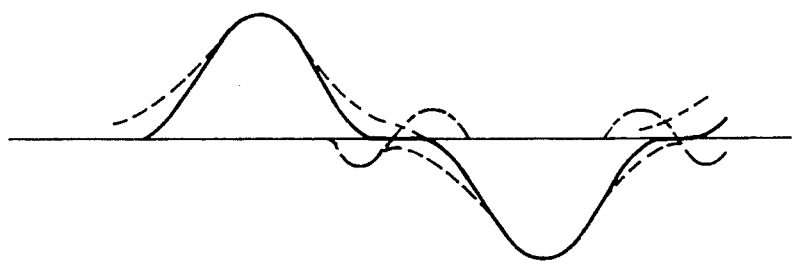
FIGS. 3B, 5B and 6B are graphs respectively showing the light amplitude distributions of the Levenson and half tone-type masks of FIGS. 3A, 5A and 6A.
Figure 3C:
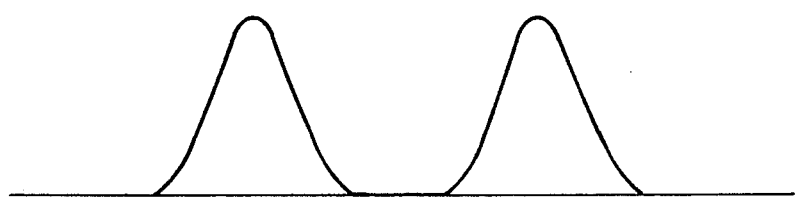
FIGS. 3C, 5C and 6C are graphs respectively showing the light intensity distributions of the Levenson and half tone-type masks of FIGS. 3A, 5A and 6A.

In other words, with an exposure mask comprising translucent phase shift patterns 32 and transparent phase shift patterns 33 which are arranged in a manner as described above, the phase shift effect is observed in each of the patterns. FIG. 3B shows the distribution of amplitude of light at the bottom of the mask of FIG. 3A. In FIG. 3B, the dotted line represents the distribution of amplitude of the rays of light that have passed through a transparent phase shift pattern 33, whereas the broken line represents the distribution of amplitude of the rays of light that have passed through a translucent phase shift pattern 32, the solid line representing the synthesized effect of the patterns 32 and 33 on the amplitude of light passing though the mask. FIG. 3C shows the distribution of light intensity obtained by squaring the values of the amplitude of FIG. 3B. It will be seen by comparing the performance of a conventional Levenson-type phase shift mask with that of a mask according to the invention that the latter provides a better pattern separation and an improved light intensity profile.

What needs to be stressed here is that a double layer structure of a transparent phase shift pattern layer 33 and a translucent phase shift pattern layer 32 appears at and near each of the edges of the translucent phase shift patterns 32 having an adjacent transparent phase shift pattern 33. The double layer structure is essential to realize a phase shift of 180° for adjacent transparent areas of all patterns.

FIG. 4A is a schematic sectional partial view of another exposure mask according to the invention comprising transparent phase shift patterns formed by engraving a transparent substrate. Here, each of the engraved areas shows a phase shift of 360° relative to adjacent translucent phase shift patterns and the light intensity profile of such a mask is not as neat as that of the mask of FIG. 3A as clearly seen by comparing FIGS. 3B and 3C respectively with FIGS. 4B and 4C and, therefore, the exposure mask of FIG. 4A is relatively poor in performance. Reference numerals 41, 42 and 43 in FIG. 4A respectively denotes a transparent substrate, translucent phase shift patterns and grooves cut into the substrate.

Figure 5A:
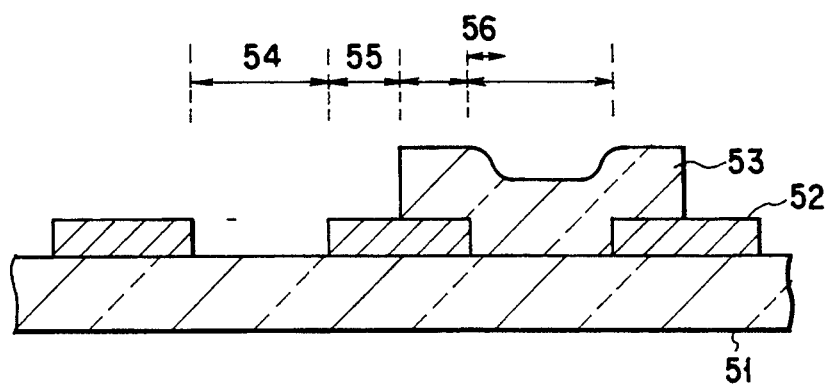
Figure 5B:
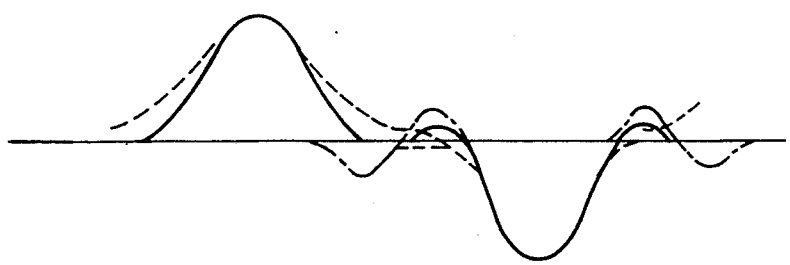

In FIG. 5A showing another mask according to the invention and comprising transparent phase shift patterns formed by an isotropic technique, each of the transparent phase shift patterns 53 is riding on and near the oppositely disposed edges of adjacent translucent phase shift patterns 52. With such an arrangement, the phase of the transparent phase shift patterns is shifted at 56 where the level of the transparent phase shift patterns 53 is raised by a value that corresponds to the difference of level. If, for instance, i beams are used for exposure, the film thickness of the transparent phase shift patterns will be 388.2 nm at 56, assuming that their refractive index is equal to 1.47. On the other hand, the film thickness of the translucent phase shift patterns 52 will be 80 nm. Thus, the level of the transparent phase shift patterns will be raised at the edges of the translucent phase shift patterns by 80 nm from the lower level of the transparent phase shift patterns which stands 388.2 nm from surface of the substrate. Consequently, the phase of the transparent phase shift patterns is shifted excessively by 37° so that a phase difference that continuously varies from 180° to 217° will be generated.

Figure 5C:
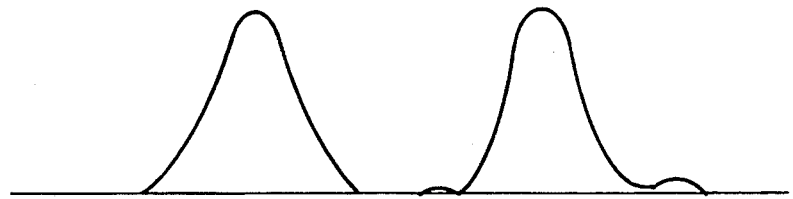

Then, the light intensity distribution (FIG. 5C) for such a mask will show a narrow bandwidth at areas 55 that correspond to transparent phase shift patterns 53 as compared with the bandwidth at areas 54 that correspond to the exposed areas of the substrate 51 and the edges of the transparent phase shift patterns 53 may relatively easily maintain a high light intensity level at and near their edges. All these problems serve to reduce the resolution and the depth of focus of the mask.

Figure 6A:
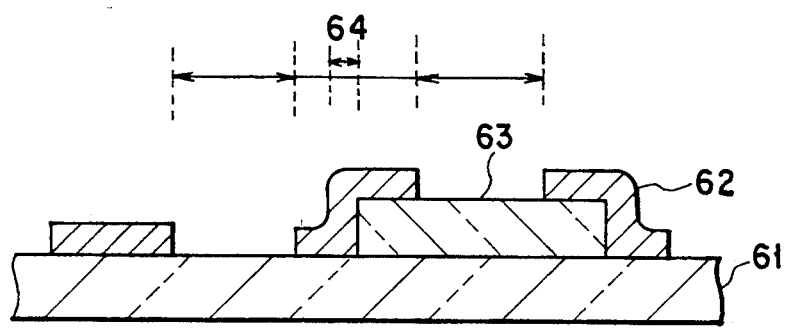
Figure 6B:
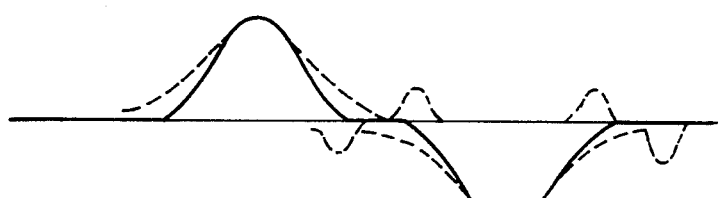
Figure 6C:
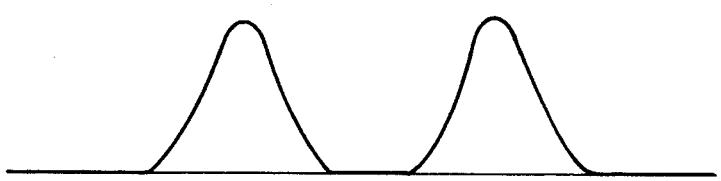
Figure 6D:
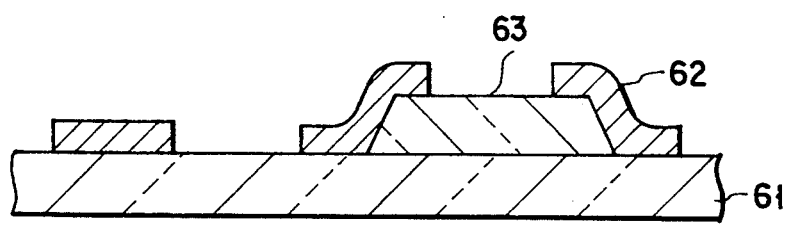

These problems, however, can be resolved by structures as shown respectively in FIGS. 6A and 6D. In the structure of FIG. 6A, a pair of translucent phase shift patterns 62 are laid on a translucent phase shift pattern 63 to avoid the problem of transparent phase shift patterns 63 riding on translucent phase shift patterns 62. Thus, the phase of rays of light passing though the mask is shifted by either 0° or 180° to fully exploit the phase shift effect of the transparent phase shift patterns 63. (See FIGS. 6B and 6C).

Additionally, in the structure of FIG. 6A, the phase of the translucent phase shift patterns 62 is shifted by a value that correspond to the difference of level of the transparent phase shift patterns 63 as the latter are partly raised at locations 64. But, the effect of this phase shift is practically nullified by the fact that the translucent phase shift patterns almost lose their light transmissivity to become almost opaque at locations 64 because of the increase in the overall film thickness at those locations.

It should be noted here that the phase shift of the translucent phase shift patterns has an effect of eliminating any interference of rays of light between adjacent transparent phase shift patterns that shows a phase shift of 180° at the pattern edges. Therefore, the existence of an opaque area at the center of each of the translucent phase shift pattern does not adversely affect the phase shift effect of the translucent phase shift patterns.

A mask having a configuration as shown in FIG. 6A may be prepared in a manner as described below.

Firstly, patterns are formed by partly etching a transparent substrate to engrave patterns on the substrate so that they may show a phase shifted by 180° relative to that of the substrate. Thereafter, a transparent phase shift film is evenly formed on the substrate and subsequently transparent phase shift patterns are formed there either by partly etching it or by using a selective growth technique. Then, a translucent phase shift film is formed on the entire surface of the substrate and thereafter translucent phase shift patterns are produced either by partly removing the film or by selectively depositing an additional translucent phase shift film on the already formed translucent phase shift film.

Note that the lateral walls of the transparent phase shift patterns 63 are perpendicular to the surface of the substrate 61, they may alternatively be inclined relative to the surface of the substrate 61 as shown in FIG. 6D.

When a translucent phase shift film having a transmissivity not smaller than 2% is used for an exposure mask of FIG. 6A or 6C, the areas of the substrate surface other than the pattern areas may preferably be covered by an opaque film of a material such as chromium (Cr). This is because, when such a translucent phase shift film is used, rays of light that have passed though the translucent phase shift film may irradiate the areas of the substrate surface other than the pattern areas to degrade the contours of the pattern and such degradation may be prevented by providing opaque films that protect the areas of the substrate surface other than the pattern areas against irradiation.

Now, the difference between a conventional Levenson-type exposure mask and an exposure mask according to the third and fourth aspect of the invention will be described by referring to FIGS. 7A through 7C. FIG. 7A shows a sectional view of a conventional Levenson-type mask and that of a mask according to the invention, while FIG. 7B shows graphs of their respective amplitude distributions and FIG. 7C illustrates graphs of their respective intensity distributions. Note that the Levenson-type exposure mask of FIG. 7A has a configuration similar to that of the mask according to the invention.

There has not been known any Levenson-type exposure mask where each of the boundaries of its phase shift areas is at least partly located along a equidistant line of two adjacent edges of the related translucent phase shift patterns. There has not been known any Levenson-type exposure mask where the boundaries of its phase shift areas is located away from the opaque film in the direction of an optical axis.

With a conventional Levenson-type exposure mask, pattern separation having a negative interference effect 71 on pattern edges can be realized at 73 by arranging phase shift areas in a zigzag manner on orifices of repeated patterns. But, only a less remarkable effect achievable for a mask carrying only opaque films can be realized for isolated patterns as shown at 73a.

Contrary to this, with an exposure mask according to the invention, a same phase shift effect can be exerted on both repeated patterns and isolated patterns by installing translucent phase shift films 75 in place of conventional opaque films 76. On repeated patterns, not only a negative interference effect obtainable in a Levenson-type mask but also a negative interference effect 72 obtainable between a transparent phase shift area and a translucent phase shift area are present so that there can be realized a steep gradient in the rise or fall of light intensity 74 at edges of repeated patterns to be formed as opaque patters on a wafer. Additionally, the inherent effect 74a of translucent phase shift patterns can be fully exerted to produce a favorable depth of focus for isolated patterns.

For an exposure mask according to the third and/or fourth aspects of the invention, it is necessary to provide a relative phase difference of 180° for any two adjacent ones of the patterns that the mask comprises and, in order to achieve this, each of the boundaries of its phase shift areas is at least partly located along a equidistant line of two adjacent edges of the related translucent phase shift patterns or the opaque films. If, for instance, each of the transparent phase shift areas of the mask is disposed side by side near a corresponding translucent phase shift pattern but they do not form a multilayer structure or if each of the transparent phase shift patterns is formed by engraving an area of the substrate separating two adjacent translucent phase shift patterns, the transparent phase shift patterns will show a phase shifted by 360° from that of the translucent phase shift patterns to produce no phase shift effect.

Now, some of the requirements of an exposure mask according to the third and/or fourth aspects of the invention will be described below.

When recesses are formed on a transparent substrate by etching, the recesses are required to have a depth t greater than T which is a function of the desired phase difference $\Delta\phi$, where T is expressed by formula 1 below.

$$T = \lambda \times \Delta\phi / 360 |n_1 - n_2| \quad (1)$$

where $\lambda$ is the wavelength of exposure light, $n_1$ is the refractive index of the substrate relative to exposure light, $n_2$ is the refractive index of the substance to fill the recesses and $\Delta\phi$ is the relative phase difference generated between the filling substance and the remaining areas of the mask. The substance to fill the recesses may be liquid or gas such as air.

Now, the recesses are filled by the substance having a refractive index of $n_2$ relative to exposure light. At this stage, the height to which the recesses are filled needs to be equal to or greater than T. The relationship between t and T needs to be expressed by either formula (2) or formula (3) below.

$$t > T \quad (2)$$

In this case, a transparent substrate having a planar surface and capable of generating the desired phase difference can be prepared by scraping the exposure areas of the substrate by t-T after filling the recesses with a substance having a refractive index of $n_2$ relative to exposure light.

$$t = T \quad (3)$$

In this case, the extent to which the exposure areas of the substrate is scraped may take any value if the surface of the substrate is kept planar in the exposure areas and the substrate itself is not scraped.

Now, it is possible to form a film on all the exposure areas of the transparent by deposition and produce an exposure mask showing no difference in the rate of transmission of light throughout the exposure areas by scraping the deposited films, taking multiple reflections into account, so that the intensity of transmitted light may be identical at any point of the bottom of the substrate regardless of the phase shift areas and the remaining areas. Differently stated, the light transmission media may have an identical history for rays of light passing through the recessed areas 77 and those passing through the projected areas 78. In other words, both rays of light passing through the recessed areas 77 and those passing through the projected areas 78 eventually reach the respective translucent phase shift films 75 after having been transmitted through the substrate and the respective deposited films. With such an arrangement of making the media have an identical history, an exposure mask showing no difference in the rate of transmission of light can be obtained.

It should be noted here that, if the recesses are filled with a liquid or a gas having a refractive index of $n_2$, the relationship between t and h must satisfy formula 3 above. Additionally, the surface of the substrate needs to be covered by a transparent plate in order to prevent the substance having an refractive index of $n_2$ from flowing out when the exposure mask is installed in an exposure apparatus. The material to be used for the transparent plate may be the same as or different from that of the transparent substrate. Some of the materials that may be used for the transparent plate include $SiO_2$, $Al_2O_3$, $MgF_2$ and $CaF_2$.

In order to provide an optimum phase relationship between the translucent phase shift patterns and the phase shift areas of an exposure mask according to the invention, it is preferable that each of the boundaries of its phase shift areas is at least partly located along a equidistant line of two adjacent edges of the related translucent phase shift patterns or the opaque films.

Now, the present invention will be described further on by way of examples.

Example 1

In this example, an exposure mask for use with KrF excimer laser was prepared.

Figure 8A:
FIGS. 8A through 8G are sectional views of an exposure mask according to the invention used in Example 1 as described hereinafter, showing steps for preparing it.

Firstly, as shown in FIG. 8A, an $SiN\alpha$ ($0.8 < \alpha < 1.2$) film (translucent film) 82 was formed as a translucent film to a thickness of 75 nm on an $SiO_2$ transparent substrate 81 designed for alignment purposes by sputtering in a nitrogen atmosphere, using silicon as target, while appropriately controlling the nitrogen concentration relative to silicon. The film showed a phase difference of 180° and an amplitude transmissivity of 19.6% to exposure light.

Figure 8B:
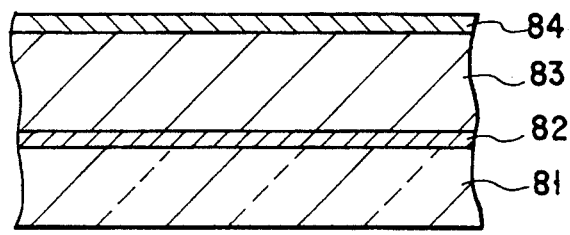
Figure 8C:
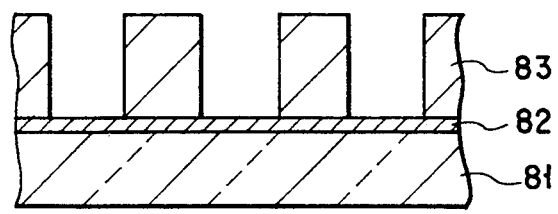
Figure 8D:
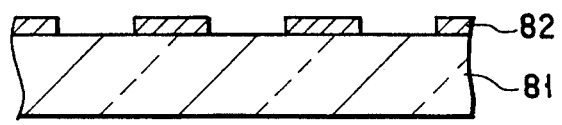

Thereafter, as shown in FIG. 8B, a resist 83 was applied to the SiNα film 82 to a thickness of 1.0 μm and then a conductive film 84 was formed by application of a conductive material to a thickness of 0.2 μm. Subsequently, as shown in FIG. 8C, the conductive film was exposed to light at a rate of 6 μC/cm² and resist patterns were produced by photographically developing the exposed film. Then, as illustrated in FIG. 8D, the exposed areas of the translucent film 82 were removed by using the pattern carrying resist as a mask. Thereafter, the resist 83 was peeled off to produce translucent phase shift patterns.

Figure 8E:
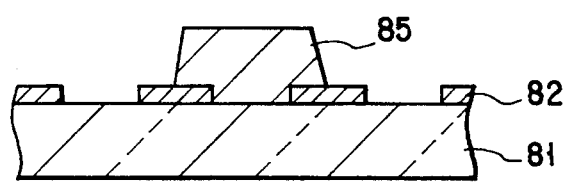

Then, as shown in FIG. 8E, an electron beam resist 85 was applied to the obtained transparent substrate for alignment to a thickness of 1.0 μm and thereafter a transparent conductive film (not shown) was formed to a thickness of 0.2 μm. Subsequently, the film was exposed to light at a rate of 6 μC/cm² and resist patterns were produced by photographically developing the exposed film.

Figure 8F:
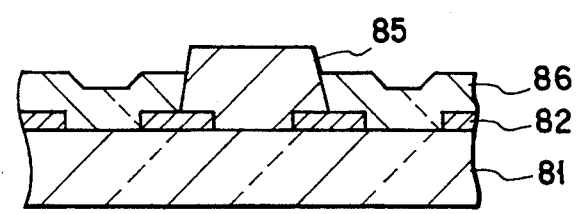
Figure 8G:
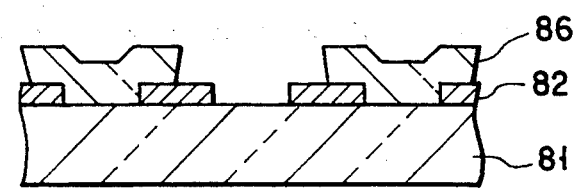

Then, as shown in FIG. 8F, an SiO₂ film (transparent film) 86 was selectively formed by deposition on the exposed areas of the SiO₂ transparent alignment substrate 81. Thereafter, as shown in FIG. 8G, transparent phase shift patterns were formed by removing the resist 85. At this stage, the deposited film has a thickness of 248 nm and showed a phase shifted by 180° relative to that of the areas of the film carrying no transparent phase shift pattern.

When, for the purpose of comparison, a resist for KrF excimer laser available from Shipley Corporation under the tradename of SNR was used to form a film to a thickness of 1.0 μm, which was then exposed to light, for a conventional Levenson-type phase shift mask comprising opaque patterns to a thickness of 0.3 μm and phase shifter films for a phase shift between 0 and 180°, the mask showed a depth of focus of 1.0 μm when any two adjacent patterns had phases inverted relative to each other but did not provide a required dimensional accuracy though it showed a satisfactory resolution so long as no phase shift was involved.

Contrary to this, when the exposure mask of this example was exposed to light, it showed a depth of focus of 1.5 μm at adjacent areas having phases inverted relative to each other and 0.3 μm at adjacent areas having an identical phase.

While SiNα was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to SiO₂ and may be formed by using a substance having a transmissivity of not less than 95% to light to which it is exposed such as Si₃N₄, CaF₂ or MgF₂. The method of preparing an exposure mask described for the above example may be used with beams of other than KrF exposure wavelength such as g line, i line of a mercury lamp, or beams having other wavelengths.

Example 2

An exposure mask was prepared by the method described for Example 1 above so that patterns may be produced at the edges of its transparent phase shift patterns.

When, for the purpose of comparison, a resist available from Shipley Corporation under the tradename of SNR was used to form a film to a thickness of 1.0 μm, which was then exposed to light, for a conventional mask comprising opaque patterns and phase shifter films for a phase shift between 0 and 180°, 0.25 μm patterns formed by using the edge sections of the transparent phase shift patterns showed a depth of focus of 1.25 μm. 0.4 μm patterns realized by using the opaque areas showed a depth of focus of 0.2 μm.

Contrary to this, when the exposure mask of this example comprising translucent phase shift patterns and transparent phase shift patterns was exposed to light, 0.4 μm patterns formed by using the translucent phase shift patterns showed a remarkably increased depth of 0.8 μm, although 0.25 μm patterns produced by using the edge sections showed a depth of focus of 1.2 μm comparable to the corresponding patterns of a conventional mask.

Example 3

In this example, an exposure mask for use with a KrF excimer laser was prepared.

Firstly, as described above for Example 1, an SiNα film was formed as a translucent film to a thickness of 75 nm on an SiO₂ transparent substrate designed for alignment purposes by sputtering in a nitrogen atmosphere, using silicon as target, while appropriately controlling the nitrogen concentration relative to silicon. The film showed a phase difference of 180° and an amplitude transmissivity of 19.6% to exposure light.

Thereafter, a resist was applied to the film to a thickness of 1.0 μm and then a conductive film was formed by application of a conductive material to a thickness of 0.2 μm. Subsequently, the conductive film was exposed to light at a rate of 6 μC/cm² and resist patterns were produced by photographically developing the exposed film. Then, the exposed areas of the translucent were removed by using the pattern carrying resist as a mask. Thereafter, the resist was peeled off to produce translucent phase shift patterns. Subsequently an SiO₂ layer was formed on the entire surface of the substrate by a CVD technique.

Then, an electron beam resist was applied to the obtained transparent substrate for alignment to a thickness of 1.0 μm and thereafter a transparent conductive film was formed to a thickness of 0.2 μm. Subsequently, the film was exposed to light at a rate of 6 μC/cm² and resist patterns were produced by photographically developing the exposed film. Following this, the exposed CVD-SiO₂ film was removed by etching. Thereafter, transparent phase shift patterns were formed by removing the resist. At this stage, the deposited film has a thickness of 248 nm and showed a phase shifted by 180° relative to that of the areas of the film carrying no transparent phase shift pattern.

When, for the purpose of comparison, a resist for KrF excimer laser available from Shipley Corporation under the tradename of SNR was used to form a film to a thickness of 1.0 μm, which was then exposed to light, for a conventional Levenson-type phase shift mask comprising opaque patterns to a thickness of 0.3 μm and phase shifter films for a phase shift between 0 and 180°, the mask showed a depth of focus of 1.0 μm when any two adjacent patterns had phases inverted relative to each other but did not provide a required dimensional accuracy though it showed a satisfactory resolution so long as no phase shift was involved.

Contrary to this, when the projection exposure mask of this examples was exposed to light, it showed a depth of focus of 1.5 μm at adjacent areas having phases inverted relative to each other and 0.3 μm at adjacent areas having an identical phase.

While SiNα was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them. The amplitude transmissivity of the translucent phase shift film may be appropriately adjusted to a value between 10 and 30%.

The material of the transparent phase shift film is not limited to $SiO_2$ and may be formed by using a substance having a transmissivity of not less than 95% to light to which it is exposed such as $CaF_2$ or $MgF_2$. The method of preparing an exposure mask described for the above example may be used with beams of other than KrF exposure wavelength as g line, i line of a mercury lamp, KrF or beams having other wavelengths.

Example 4

In this example, an exposure mask for use with the i line of a mercury lamp was prepared.

Firstly, an SiNβ ($0.5 < \beta < 0.8$) film was formed as a translucent film to a thickness of 65 nm on an $SiO_2$ transparent substrate designed for alignment purposes by sputtering in a nitrogen atmosphere, using silicon as target, while appropriately controlling the nitrogen concentration relative to silicon. The film showed a phase difference of 180° and an amplitude transmissivity of 18% to exposure light.

Thereafter, a resist was applied to the film to a thickness of 1.0 μm and then a transparent conductive film was formed by application of a conductive material to a thickness of 0.2 μm. Subsequently, the conductive film was exposed to light at a rate of 6 μC/cm$^2$ and resist patterns were produced by photographically developing the exposed film. Then, the exposed areas of the translucent were removed by using the pattern carrying resist as a mask. Thereafter, the resist was peeled off to produce translucent phase shift patterns.

Then, a resist designed for use with electron beams was applied to the obtained transparent substrate for alignment to a thickness of 1.0 μm and thereafter a transparent conductive film was formed by application to a thickness of 0.2 μm. Subsequently, the film was exposed to light at a rate of 6 μC/cm$^2$ and resist patterns were produced by photographically developing the exposed film. Following to this, an $SiO_2$ film was selectively formed on the exposed areas of the $SiO_2$ transparent substrate for alignment in a liquid phase and the resist was removed to produce transparent phase shift patterns. At this stage, the deposited film has a thickness of 425 nm and showed a phase shifted by 180° relative to that of the areas of the film carrying no transparent phase shift pattern.

When, for the purpose of comparison, PFR-IX500 resist (tradename, available from Japan Synthetic Rubber Co., Ltd.) was used to form a film to a thickness of 1.2 μm, which was then exposed to light, for a conventional Levenson-type phase shift mask comprising opaque patterns to a thickness of 0.35 μm and phase shifter films for a phase shift between 0 and 180°, the mask showed a depth of focus of 1.0 μm when any two adjacent patterns had phases inverted relative to each other but did not provide a required dimensional accuracy though it showed a satisfactory resolution so long as no phase shift was involved.

Contrary to this, when the projection exposure mask of this examples was exposed to light, it showed a depth of focus of 1.0 μm at adjacent areas having phases inverted relative to each other and 0.6 μm at adjacent areas having an identical phase to prove a remarkable improvement for the overall depth of focus.

While SiNβ was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them. The amplitude transmissivity of the translucent phase shift film may be appropriately adjusted to a value between 10 and 30%.

The material of the transparent phase shift film is not limited to $SiO_2$ and may be formed by using a substance having a transmissivity of not less than 95% to light to which it is exposed such as $CaF_2$ or $MgF_2$. The method of preparing an exposure mask described for the above example may be used with beams of other than KrF exposure wavelength such as g beams or i beams.

Example 5

In this example, an exposure mask for use with i beams was prepared.

Figure 9A:
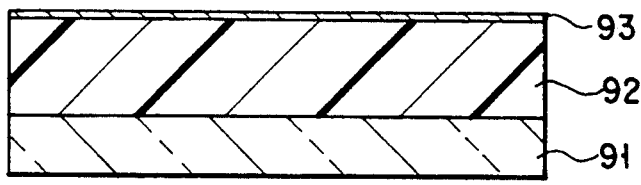
FIGS. 9A through 9I are sectional views of an exposure mask according to the invention used in Example 1 as described hereinafter, showing steps for preparing it.
Figure 9B:
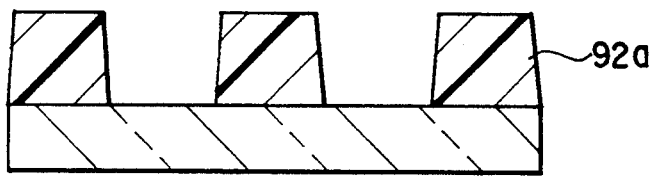
Figure 9C:
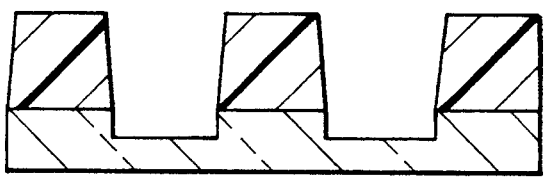
Figure 9D:

Firstly, as shown in FIG. 9A, a resist 92 designed for use with electron beams was applied to the surface of an $SiO_2$ substrate 91 designed for alignment purposes to a thickness of 92 μm and subsequently a conductive film 93 was formed by applying a conductive material to a thickness of 0.2 μm. Thereafter, the film was exposed to electron beams at a rate of 6 μC/cm$^2$ and resist patterns 92a were produced by photographically developing the exposed film as shown in FIG. 9B. Then, as illustrated in FIG. 9C, the exposed areas of the substrate was anisotropically etched by using the resist patterns as a mask and a mixture gas of $CF_4$ and $O_2$. The substrate was etched to a depth of 388.2 nm and the etched areas showed a phase shifted by 180° relative to that of the unetched areas. The allowance for a phase shift of 180° is ±10° and it was found that the obtained phase shift satisfied this requirement. The resist patterns 92a were then removed by immersing the mask in an aqueous solution containing a mixture of sulfuric acid and hydrogen peroxide to produce transparent phase shift patterns as illustrated in FIG. 9D.

Figure 9E:

Thereafter, as shown in FIG. 9E, a translucent phase shift film 94 was formed on the surface of the transparent phase shift pattern carrying substrate to a thickness of 65 nm in a thin nitrogen atmosphere by sputtering, using silicon as target. The film was made of SiNβ.

Figure 9F:
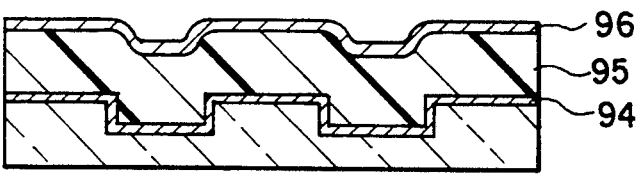
Figure 9G:
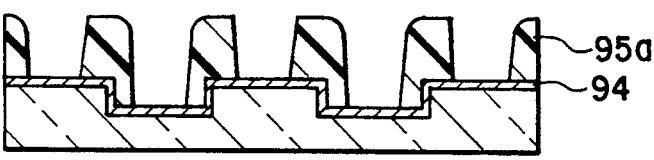
Figure 9H:
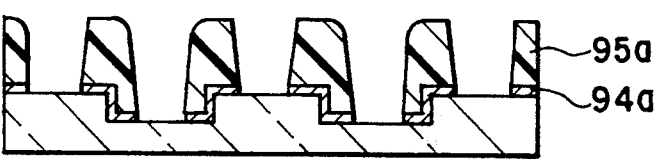
Figure 9I:

Then, a resist 95 designed for use with electron beams was applied to the obtained film to a thickness of 1.0 μm and thereafter a conductive film 96 was formed by application of a conductive material to a thickness of 0.2 μm as shown in FIG. 9F. Subsequently, the film was exposed to light at a rate of 6 μC/cm$^2$ and resist patterns 95a were produced by photographically developing the exposed film as shown in FIG. 9G. Following this, exposed areas of the translucent phase shift film 94 were removed by using the resist patterns 95a as a mask (FIG. 9H). Then, as shown in FIG. 9I, a translucent phase shift film 94a was obtained by peeling off the resist.

When, for the purpose of comparison, PFR-IX500 resist (tradename, available from Japan Synthetic Rubber Co., Ltd.) was used to form a film to a thickness of 1.2 μm, which was then exposed to light, for a conventional Levenson-type phase shift mask comprising opaque patterns to a thickness of 0.35 μm and phase shifter films for a phase shift between 0 and 180°, the mask showed a depth of focus of 1.0 μm when any two adjacent patterns had phases inverted relative to each other but did not provide a required dimensional accuracy though it showed a satisfactory resolution so long as no phase shift was involved.

Contrary to this, when the projection exposure mask of this examples was exposed to light, it showed a depth of focus of 1.8 μm at adjacent areas having phases inverted relative to each other and 0.6 μm at adjacent areas having an identical phase to prove a remarkable improvement for the overall depth of focus.

While SiNβ was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to $SiO_2$ and may be formed by using a substance having a transmissivity of not less than 95% to light to which it is exposed such as $CaF_2$ or $MgF_2$. The method of preparing an exposure mask described for the above example may be used with beams of other than i line exposure wavelength such as g line, h line of a mercury lamp or KrF beams.

Example 6

An exposure mask was prepared by the method described for Example 5 above so that patterns may be produced at the edges of its transparent phase shift patterns.

When, for the purpose of comparison, PFR-IX500 resist (tradename, available from Japan Synthetic Rubber Co., Ltd.) was used to form a film to a thickness of 1.0 μm, which was then exposed to light, for a conventional mask comprising opaque patterns and phase shifter films for a phase shift between 0 and 180°, 0.25 μm patterns formed by using the edge sections of the transparent phase shift patterns showed a depth of focus of 1.25 μm. 0.4 μm patterns realized by using the opaque areas showed a depth of focus of 0.2 μm.

Contrary to this, when the projection exposure mask of this examples was exposed to light, 0.4 μm patterns formed by using the translucent phase shift patterns showed a remarkably increased depth of 1.0 μm, although 0.25 μm patterns produced by using the edge sections showed a depth of focus of 1.0 μm comparable to the corresponding patterns of a conventional mask.

The method of preparing an exposure mask described for the above example may be used with beams of other than i line exposure wavelength such as g line, h line of a mercury lamp or KrF beams.

Example 7

In the example, an exposure mask for use with KrF laser was prepared.

Figure 10A:
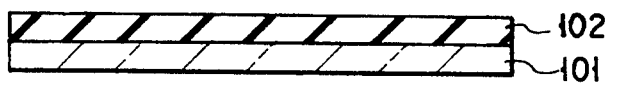
FIGS. 10A through 10J are sectional views of an exposure mask according to the invention used in Example 7 as described hereinafter, showing steps for preparing it.
Figure 10B:
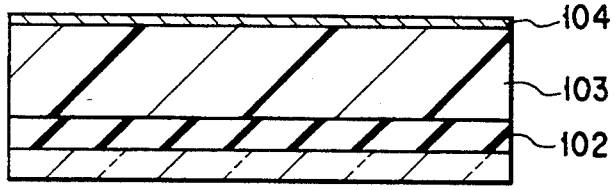
Figure 10C:
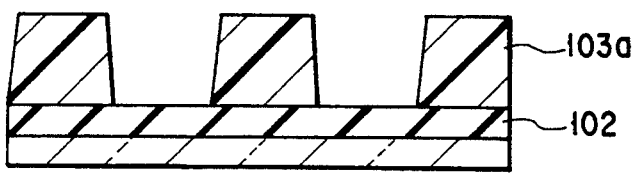
Figure 10D:
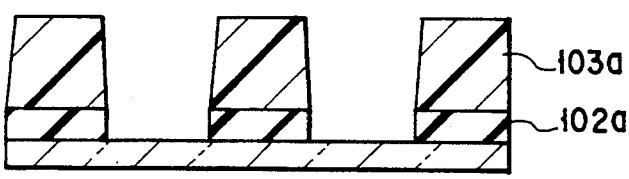
Figure 10E:

Firstly, as shown in FIG. 10A, an $Al_2O_3$ film 102 was formed to a thickness of 410 nm on an $SiO_2$ substrate 101 designed for alignment purposes. Then, a resist 103 designed for use with electron beams was applied thereto to form a film having a thickness of 1.0 μm and, as shown in FIG. 10B, a conductive film 104 was formed by applying a conductive material to a thickness of 0.2 μm. Thereafter, the film was exposed to electron beams at a rate of 6 μC/cm$^2$ and resist patterns 103a were produced by photographically developing the exposed film as shown in FIG. 10C. Then, as illustrated in FIG. 10D, the exposed areas of the substrate was anisotropically etched by using the resist patterns as a mask and $Cl_2$ gas. Thereafter, the resist patterns 103a were removed by exposing them to $O_2$ plasma to produce transparent phase shift patterns 102a having a phase shifted by 180° relative to that of the unetched areas as shown in FIG. 10E.

Figure 10F:

Thereafter, a translucent phase shift film 105 was formed on the surface of the substrate that carried the transparent phase shift patterns. More specifically, a transparent SiNα film 105 was formed to a thickness of 85 nm in a thin nitrogen atmosphere by sputtering, using silicon as target as shown in FIG. 10F.

Figure 10G:
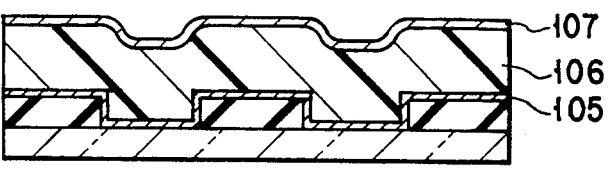
Figure 10H:
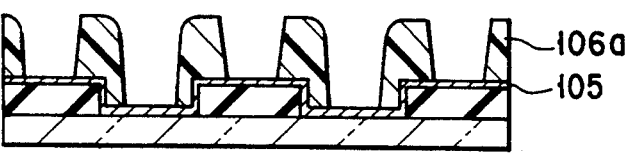
Figure 10I:
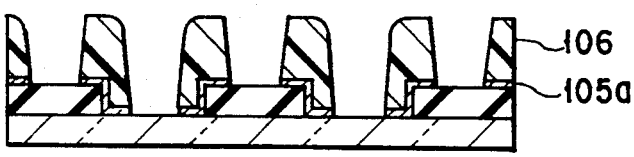
Figure 10J:

Then, a resist 106 designed for use with electron beams was applied to the obtained film to a thickness of 1.0 μm and thereafter a conductive film 107 was formed by application of a conductive material to a thickness of 0.2 μm as shown in FIG. 10G. Subsequently, the film was exposed to electron beams at a rate of 6 μC/cm$^2$ and resist patterns 106a were produced by photographically developing the exposed film as shown in FIG. 10H. Following to this, exposed areas of the translucent phase shift film 105 were removed by anisotropic etching, using $CF_4$ gas and the resist patterns 106a as a mask as shown in FIG. 10I. Then, as shown in FIG. 10J, a translucent phase shift film 105a was obtained by peeling off the resist.

When, for the purpose of comparison, a resist available from Shipley Corporation under the tradename of SNR was used to form a film to a thickness of 1.0 μm, which was then exposed to light, for a conventional Levenson-type phase shift mask comprising opaque patterns to a thickness of 0.3 μm and phase shifter films for a phase shift between 0 and 180°, the mask showed a depth of focus of 1.5 μm when any two adjacent patterns had phases inverted relative to each other but did not provide a required dimensional accuracy though it showed a satisfactory resolution so long as no phase shift was involved.

Contrary to this, when the projection exposure mask of this examples was exposed to light, it showed a depth of focus of 1.8 μm at adjacent areas having phases inverted relative to each other and 0.3 μm at adjacent areas having an identical phase to prove a remarkable improvement for the overall depth of focus.

While SiNα was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to $Al_2O_3$ and may be formed by using a substance having a transmissivity of not less than 95% to light to which it is exposed such as $CaF_2$ or $MgF_2$. The method of preparing an exposure mask described for the above example may be used with beams of other than KrF beam exposure wavelength such as g line, i line or h line of a mercury lamp.

Example 8

An exposure mask was prepared by the method described for Example 7 above so that patterns may be produced at the edges of its transparent phase shift patterns.

When, for the purpose of comparison, a resist available from Shipley Corporation under the tradename of SNR was used to form a film to a thickness of 1.0 μm, which was then exposed to light, for a conventional mask comprising opaque patterns to a thickness of 0.3 μm and phase shifter films for a phase shift between 0 and 180°, 0.25 μm patterns formed by using the edge sections of the transparent phase shift patterns showed a depth of focus of 1.2 μm. 0.4 μm patterns realized by using the opaque areas showed a depth of focus of 0.2 μm.

Contrary to this, when the projection exposure mask of this example was exposed to light, 0.4 μm patterns formed by using the translucent phase shift patterns showed a remarkably increased depth of 1.5 μm, although 0.25 μm patterns produced by using the edge sections showed a depth of focus of 1.2 μm comparable to the corresponding patterns of a conventional mask.

The method of preparing an exposure mask described for the above example may be used with beams of other than KrF beam exposure wavelength such as g line, i line or h line of a mercury lamp.

Example 9

In this example, an exposure mask for use with i line of a mercury lamp was prepared.

Figure 11A:
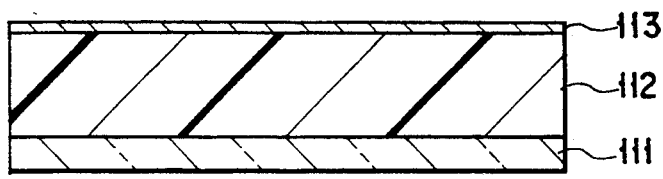
FIGS. 11A through 11I are sectional views of an exposure mask according to the invention used in Example 9 as described hereinafter, showing steps for preparing it.
Figure 11B:
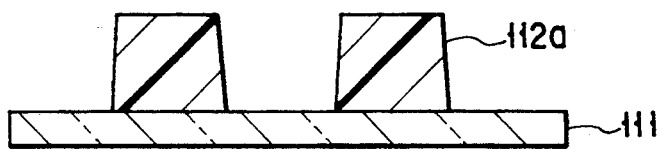
Figure 11C:
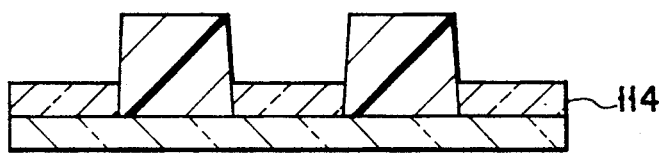

Firstly, as shown in FIG. 11A, a resist 112 designed for use with electron beams was applied to the surface of an $SiO_2$ substrate 111 for alignment to form a film having a thickness of 0.1 μm and then a conductive film 113 was formed by applying a conductive material to a thickness of 0.2 μm. Thereafter, the film was exposed to electron beams at a rate of 6 μC/cm² and resist patterns 112a were produced by photographically developing the exposed film as shown in FIG. 11B. Then, as illustrated in FIG. 11C, the exposed areas of the substrate was subjected to a selective growth of $SiO_2$. The formed film showed a thickness of 410 nm and a phase shifted by 180° relative to the areas that had not been subjected to a selective growth. The allowance for a phase shift of 180° is ±10° and it was found that the obtained phase shift satisfied this requirement.

Figure 11D:
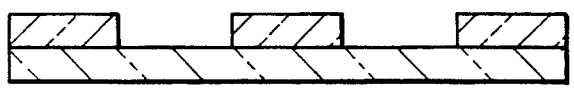

The resist patterns 112a were then removed by immersing the mask in an aqueous solution containing a mixture of sulfuric acid and hydrogen peroxide to produce transparent phase shift patterns of $SiO_2$ as illustrated in FIG. 11D.

Figure 11E:
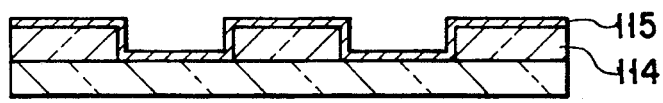

Thereafter, a translucent phase shift film 114 was formed on the surface of the transparent phase shift pattern carrying substrate in a thin nitrogen atmosphere by sputtering, using silicon as target. The film 114 was made of $SiN\beta$ and has a thickness of 85 nm as illustrated in FIG. 11E.

Figure 11F:
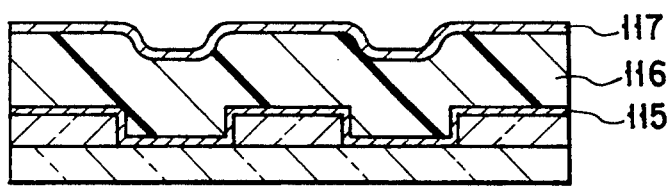
Figure 11G:
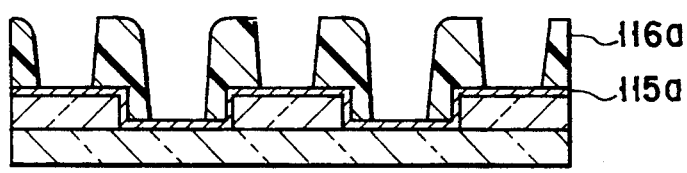
Figure 11H:
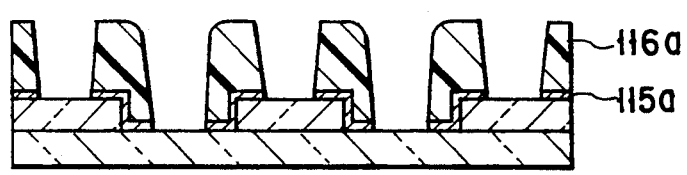
Figure 11I:
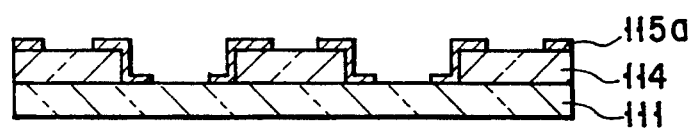

Then, a resist 116 designed for use with electron beams was applied to the obtained film to a thickness of 1.0 μm and thereafter a conductive film 117 was formed by application of a conductive material to a thickness of 0.2 μm as shown in FIG. 11F. Subsequently, the film was exposed to light at a rate of 6 μC/cm² and resist patterns 116a were produced by photographically developing the exposed film as shown in FIG. 11G. Following to this, exposed areas of the translucent phase shift film 114 were removed by using the resist patterns 116a as a mask as shown in FIG. 11H. Then, as shown in FIG. 11I, a translucent phase shift film 115a was obtained by peeling off the resist.

When, for the purpose of comparison, PFR-Ix500 resist (tradename, available from Japan Synthetic Rubber Co., Ltd.) was used to form a film to a thickness of 1.2 μm, which was then exposed to light, for a conventional Levenson-type phase shift mask comprising opaque patterns to a thickness of 0.35 μm and phase shifter films for a phase shift between 0 and 180°, the mask showed a depth of focus of 1.0 μm when any two adjacent patterns had phase inverted relative to each other but did not provide a required dimensional accuracy though it showed a satisfactory resolution so long as no phase shift was involved.

Contrary to this, when the projection exposure mask of this examples was exposed to light, it showed a depth of focus of 1.8 μm at adjacent areas having phases inverted relative to each other and 0.6 μm at adjacent areas having an identical phase to prove a remarkable improvement for the overall depth of focus.

While $SiN\beta$ was used for a translucent phase shift film in the above example, a substance selected from silicon, germanium, gallium arsenide, titanium, aluminum, chromium, tin, indium, nickel, cobalt, tantalum, metals other than those listed above, nitrides, oxides, hydrides, carbides and halogenides of the above metals and mixtures of any of them could be used. The amplitude transmissivity of the translucent phase shift film may be appropriately adjusted to a value between 10 and 30%.

The material of the transparent phase shift film is not limited to $SiO_2$ and may be formed by using another appropriate material such as $CaF_2$, $MgF_2$ or $Al_2O_3$. The method of preparing an exposure mask described for the above example may be used with beams of other than i beam exposure wavelength such as g beams, h beams or KrF beams.

Example 10

An exposure mask was prepared by the method described for Example 9 above so that patterns may be produced at the edges of its transparent phase shift patterns.

When, for the purpose of comparison, PFR-IX500 resist (tradename, available from Japan Synthetic Rubber Co., Ltd.) was used to form a film to a thickness of 1.2 μm, which was then exposed to light, for a conventional mask comprising opaque patterns to a thickness of 0.35 μm and phase shifter films for a phase shift between 0 and 180°, 0.25 μm patterns formed by using the edge sections of the transparent phase shift patterns showed a depth of focus of 1.0 μm. 0.4 μm patterns realized by using the opaque areas showed a depth of focus of 0.2 μm.

Contrary to this, when the projection exposure mask of this example was exposed to light, 0.4 μm patterns formed by using the translucent phase shift patterns showed a remarkably increased depth of 1.0 μm, although 0.25 μm patterns produced by using the edge sections showed a depth of focus of 1.0 μm comparable to the corresponding patterns of a conventional mask.

The method of preparing an exposure mask described for the above example may be used with beams of other than i beam exposure wavelength such as g beams, h beams or KrF beams.

Now, Examples 11 through 15 will be described below. These examples show an attempt to improve the dimensional accuracy of the resist patterns of Examples 5 through 10. When a (positive type) resist layer having one or more than one steps is exposed to light, the formed translucent phase shift patterns can show a high resolution exceeding the expected level because the lower portion of the resist can be left in an insufficiently exposed condition. In the following examples, this problem was resolved by planarizing the surface of transparent substrate.

Example 11

In this example, there was prepared a phase shift mask intended for use with g beams of a quick silver lamp as a light source and designed to produce a negative interference effect between adjacent orifices and between each orifice and a translucent area adjacent to it.

Figure 12A:
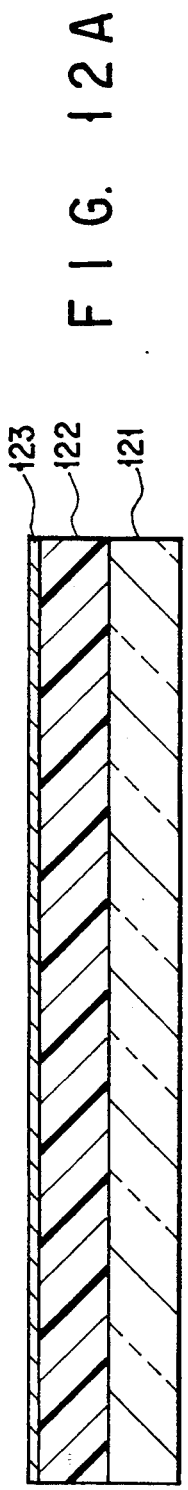
FIGS. 12A through 12K are sectional views of an exposure mask according to the invention used in Example 10 as described hereinafter, showing steps for preparing it.
Figure 12B:
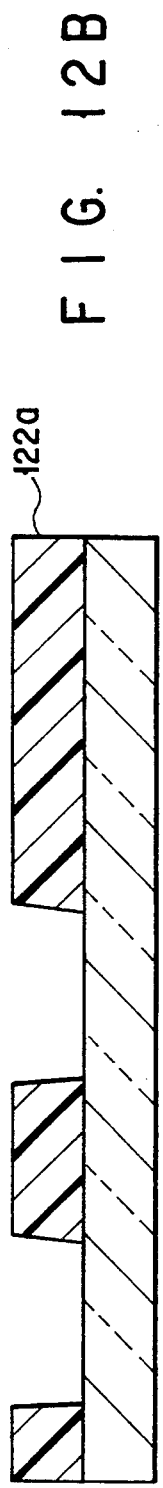
Figure 12C:
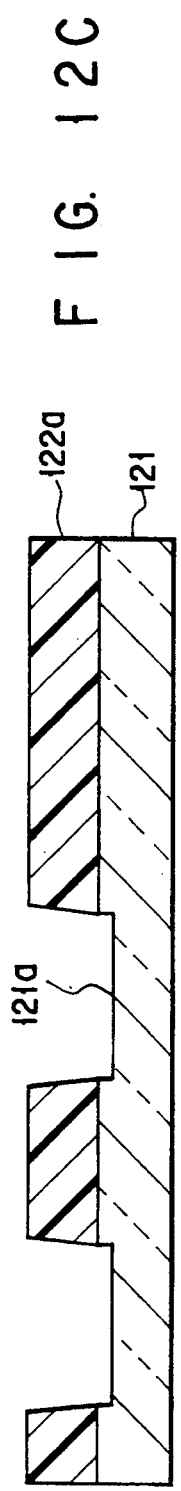
Figure 12D:
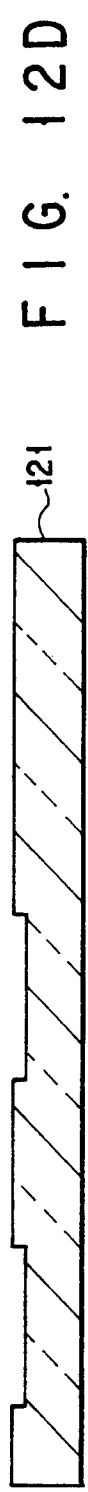

Firstly, as shown in FIG. 12A, a resist 122 designed for use with electron beams was applied to the surface of a quartz substrate 121 to form a film having a thickness of 500 nm and then a conductive film 123 was formed by applying a conductive material to a thickness of 200 nm. Thereafter, resist patterns 122a were formed by drawing the patterns on the film with electron beams and photographically developing the film as shown in FIG. 12B. Then, the substrate was anisotropically etched by $CF_4$ gas, using the resist patterns 122a as a mask and, as shown in FIG. 12C, phase shift areas 121a were formed by partially engraving the quartz substrate. Subsequently, the resist patterns 122a were then removed as shown in FIG. 12D.

Taking the refractive index of the substrate and that of a phase shift member to be formed as a film in a later step into consideration, it was necessary, at this stage, to adjust the depth of the engraved phase shift areas so that the phase of light passing though the phase shift member and that of light passing though the unengraved areas of the quartz substrate showed a shift of 180° relative to each other. As $Si_3N_4$ was used for the phase shift member in this example, the depth of the engraved phase shift areas was made to be equal to 366.4 nm, considering the refractive index of $Si_3N_4$ which is equal to 2.06.

Figure 12E:
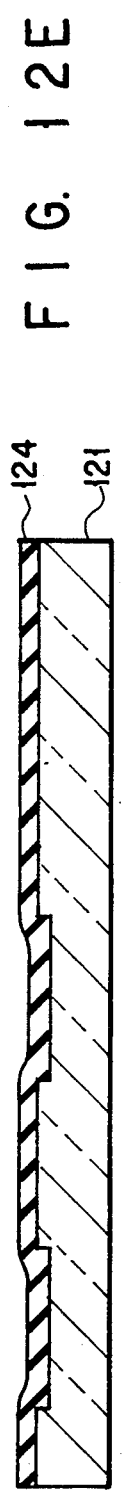
Figure 12F:

Thereafter, as shown in FIG. 12E, a transparent phase shift layer 124 of $Si_3N_4$ was formed on at least the engraved areas of the quartz substrate to a thickness of 400 nm. Note that this film thickness may be varied if it is greater than the depth of the engraved transparent phase shift areas which was equal to 366.4 nm in this example. After the formation of the film, the entire surface of the substrate was polished and planarized as shown in FIG. 12F to produce phase shift patterns in the respective transparent phase shift areas.

Figure 12G:
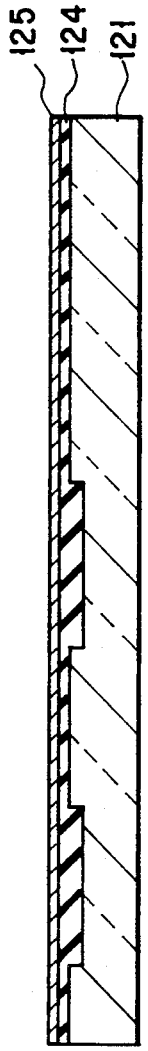

Then, as shown in FIG. 12G, a translucent phase shift film which was an amorphous silicon film 125 was formed on the surface of the planarized substrate to a thickness of 6.1 nm. Subsequently, the amorphous silicon film was so adjusted that it showed a phase differentiated by 180° from that phase of the areas carrying no amorphous silicon film and an amplitude transmissivity of 15%.

Figure 12H:
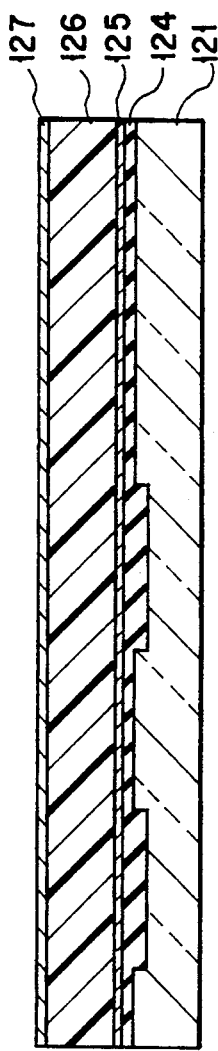
Figure 12I:
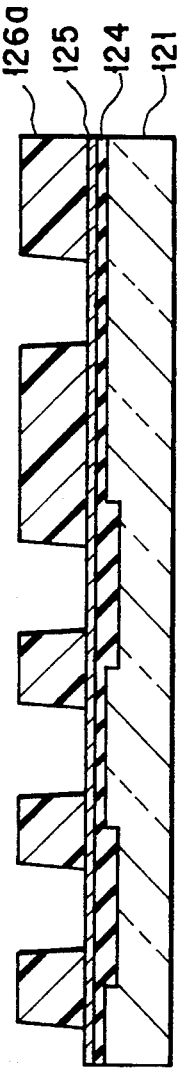

Then, a resist 126 designed for use with electron beams was applied to the obtained film to a thickness of 500 nm and, thereafter, a conductive film 127 was formed by application of a conductive material to a thickness of 200 nm as shown in FIG. 12H. Subsequently, the film was exposed to electron beams for alignment with the phase shift patterns and resist patterns 126a were produced by photographically developing the exposed film as shown in FIG. 12I.

Figure 12J:
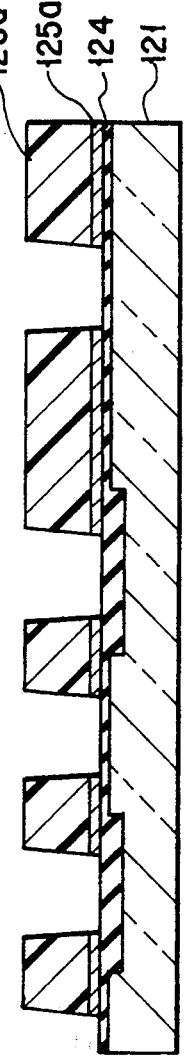
Figure 12K:
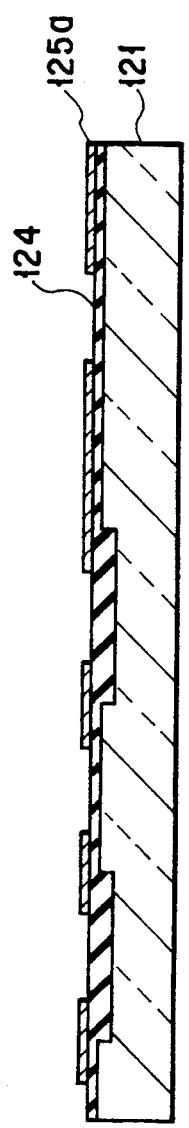

Following to this, exposed areas of the amorphous silicon film were removed to produce translucent phase shift patterns 125a by etching, using the resist patterns 126a as a mask as shown in FIG. 12J. Finally, as shown in FIG. 12K, an exposure mask with an excellent dimensional controllability was produced by peeling off the electron beam resist.

When the mask of this example was exposed to g beams, using a positive resist for g beams to a film thickness of 1.2 μm, it showed a depth of focus of 1.2 μm, at areas where repeated patterns of 0.45 μm were arranged in a zigzag manner corresponding to the transparent phase shift areas and a depth of focus of 0.5 μm at areas where no phase shift areas were found on in the transparent substrate and isolated patterns of 0.45 μm were constituted solely by translucent phase shift patterns.

While quartz was used for a transparent substrate in the above example, a substrate principally composed of $Al_2O_3$, $MgF_2$, or $CaF_2$ may alternatively be used. Additionally, while $Si_3N_4$ was used for the phase shift member in this example, any material having a refractive index different from that of the substrate and an extinction coefficient substantially equal to that of the material constituting the substrate may alternatively be used. Again, while the substrate was planarized by polishing in this example, a planar film surface may be produced for the phase shift member by forming a phase shift member in the form of a film, planarizing it and then removing the multilayer film of the phase shift member and a resin material while maintaining the rate of etching the phase shift member equal to that of etching the resin material.

While amorphous silicon was used for the translucent phase shift film in this example, it may be replaced by germanium oxide, gallium oxide or arsenide. Finally, while the mask patterns were drawn in this example by using electron beams, they may alternatively be formed by using a photoresist and exposing it to light.

Example 12

Figure 13A:
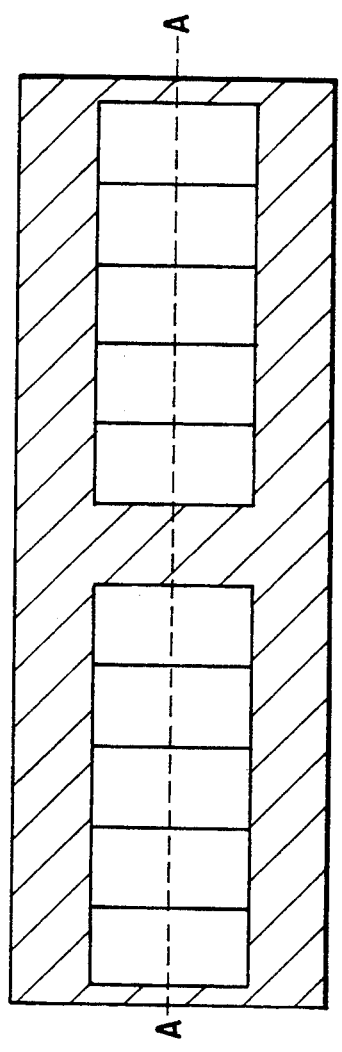
FIG. 13A is a plan view of an exposure mask according to the invention used in Example 11 as described hereinafter.
Figure 13B:
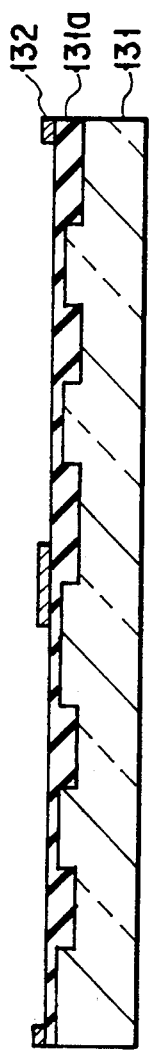
FIG. 13B is a sectional view of the exposure mask of FIG. 13A cut along line A—A.

An exposure mask was prepared by a method similar to the one used for Example 11 so that patterns may be produced at the edges of its transparent phase shift patterns. FIGS. 13A and 13B show schematic views of the mask. Reference numeral 131 in FIGS. 13A and 13B denotes a transparent mask substrate, while 131a and 132 respectively denote transparent phase shift areas and translucent phase shift areas.

When, PFR-IX500 resist (tradename, available from Japan Synthetic Rubber Co., Ltd.) was used to form a film to a thickness of 1.0 μm, which was then exposed to light, 0.25 μm patterns formed by using the edge sections of conventional transparent phase shift patterns showed a depth of focus of 1.0 μm. 0.4 μm patterns realized by using a translucent phase shift film showed also a depth of focus of 1.0 μm.

The method of preparing an exposure mask described for the above example may be used with beams of other than i line exposure wavelength such as g line, h line of a mercury lamp or KrF beams.

Example 13

In this example, there was prepared a phase shift mask intended for use with i line of a mercury lamp as light source and designed to produce a negative interference effect between adjacent orifices and between each orifice and a translucent area adjacent to it.

The steps of preparing the mask up to forming recessed patterns on the surface of a quartz substrate 141 are same as those as described above for Example 11 by referring to FIGS. 12A through FIG. 12D, provided that SiNβ was used for a phase shift member and phase shift areas were formed to a depth of 301.7 nm taking the refractive index of SiNβ which is equal to 2.08 into consideration.

Figure 14A:
Figure 14B:
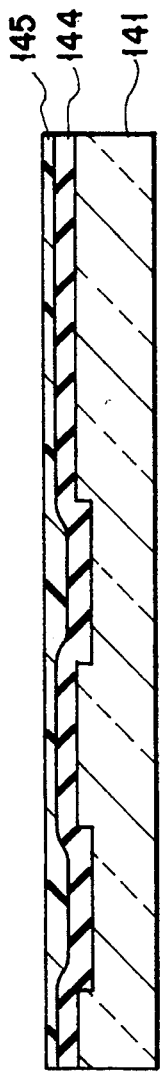
Figure 14C:

Thereafter, as shown in FIG. 14A, a transparent phase shift layer 144 of $Si_3N_4$ was formed on at least the engraved areas of the quartz substrate to a thickness of 350 nm. Note that this film thickness may be varied if it is greater than the depth of the engraved phase shift areas which was equal to 301.7 nm in this example. After the formation of the film, the entire surface of the substrate was planarized by applying a fluid resin material 145 as shown in FIG. 14B and then the phase shift member and the resin material were removed by etching to produce a planar film 144a for the phase shift member as shown in FIG. 14C, maintaining the rate of etching the phase shift member equal to that of etching the resin material.

Figure 14D:
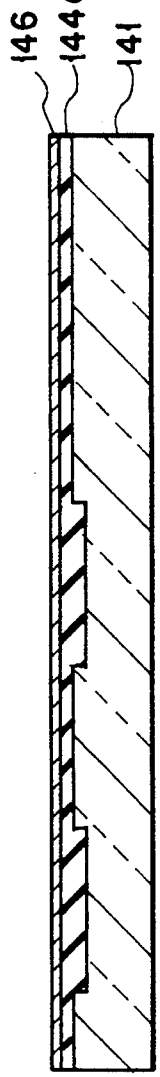

Then, as shown in FIG. 14D, an SiNβ film was formed to a thickness of 90 nm to produce a translucent phase shift film 146 on the planarized substrate. Subsequently, the SiNβ was so adjusted that it showed a phase differentiated by 180° from that phase of the areas carrying no SiNβ film and an amplitude transmissivity of 22%.

Figure 14E:
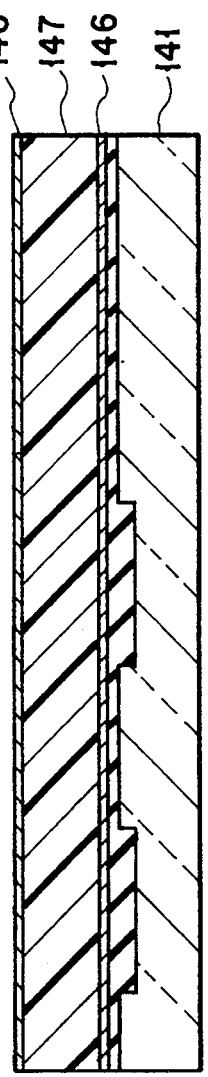

Then, as shown in FIG. 14E, a resist 147 designed for use with electron beams was applied to the substrate to form a film with a thickness of 500 nm and, thereafter, a conductive film 148 was formed by application of a conductive material to a thickness of 200 nm. Subsequently, the film was exposed to electron beams for alignment with the phase shift patterns and resist patterns 147a were produced by photographically developing the exposed film as shown in FIG. 14F.

Following to this, exposed areas of the SiNβ film were removed to produce translucent phase shift patterns 146a by etching, using the resist patterns 147a as a mask as shown in FIG. 14G. Finally, as shown in FIG. 14H, an exposures mask with an excellent dimensional controllability was produced by peeling off the resist patterns 147a.

When the mask of this examples was exposed to i beams, using PFX-IX500 resist (tradename, available from Japan Synthetic Rubber Co., Ltd.) to a film thickness of 1.2 μm, it showed a depth of focus of 1.3 μm at areas where repeated patterns of 0.35 μm were arranged in a zigzag manner corresponding to the transparent phase shift areas and a depth of focus of 0.6 μm at areas where no phase shift areas were found on in the transparent substrate and isolated patterns of 0.35 μm were constituted solely by translucent phase shift patterns.

As in the case of Example 11, the transparent substrate and the phase shift member as well as the method of planarizing them may be subject to various modifications and alterations. Additionally, while SiNβ was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances, having a strictly controlled composition could be used.

Example 14

In this example, there was prepared a phase shift mask intended for use with KrF excimer laser as light source and designed to produce a negative interference effect between adjacent orifices and between each orifice and a translucent area adjacent to it.

Firstly, a resist designed for use with electron beams was applied to the surface of a quartz substrate to form a film having a thickness of 500 nm and then a conductive film was formed by applying a conductive material to a thickness of 200 nm. Thereafter, resist patterns were formed by drawing the patterns on the film with electron beams and photographically developing the film. Then, the substrate was anisotropically etched by $CF_4$ gas, using the resist patterns as a mask and phase shift areas were formed by partially engraving the quartz substrate. Taking the refractive index of the substrate and that of a phase shift member to be formed as a film in a later step into consideration, it was necessary to adjust the depth of the engraved phase shift areas so that the phase of light passing though the phase shift member and that of light passing though the unengraved areas of the quartz substrate showed a shift of 180° relative to each other.

As $Al_2O_3$ was used for the phase shift member in this example, the depth of the engraved phase shift areas was made to be equal to 496 nm, considering the refractive index of $Al_2O_3$ which is equal to 1.74 for KrF excimer laser used as light source when the phase shift member has a thickness of 248 nm.

Thereafter, a transparent phase shift layer 124 of $Al_2O_3$ was formed on at least the engraved areas of the quartz substrate to a thickness of 500 nm. Note that this film thickness may be varied if it is greater than the depth of the engraved transparent phase shift areas which was equal to 496 nm in this example. After the formation of the film, the entire surface of the substrate was polished and planarized to produce phase shift patterns in the respective transparent phase shift areas.

Then, a translucent phase shift film which was an SiNα film was formed on the surface of the planarized substrate to a thickness of 100 nm. Subsequently, the film was so adjusted that it showed a phase differentiated by 180° from that phase of the areas carrying no SiNα film and an amplitude transmissivity of 22%.

Then, a resist designed for use with electron beams was applied to the obtained film to a thickness of 500 nm and, thereafter, the film was exposed to electron beams for alignment with the phase shift patterns and then photographically developed to produce resist patterns. Following to this, exposed areas of the SiNα film were removed to produce translucent phase shift patterns by etching, using the resist patterns as a mask. Finally, an exposure mask with an excellent dimensional controllability was produced by peeling off the electron beam resist.

When the mask of this examples was exposed to KrF beams, using SNR resist (tradename, available from Shipley Corporation) to a film thickness of 1.0 μm, it showed a depth of focus of 1.6 μm at areas where repeated patterns of 0.3 μm were arranged in a zigzag manner corresponding to the transparent phase shift areas and a depth of focus of 0.3 μm at areas where no phase shift areas were found on in the transparent substrate and isolated patterns of 0.3 μm were constituted solely by translucent phase shift patterns.

As in the case of Example 11, the transparent substrate and the phase shift member as well as the method of planarizing them may be subject to various modifications and alterations. Additionally, while SiNα was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances having strictly controlled composition could be used.

Example 15

In this example, there was prepared a phase shift mask intended for use with ArF excimer laser as light source and designed to produce a negative interference effect between adjacent orifices and between each orifice and a translucent area adjacent to it.

The steps of preparing the mask up to forming recessed patterns on the surface of a quartz substrate 151 are same as those as described above for Example 11 by referring to FIGS. 12A through FIG. 12D, provided that $N_2$ was used for a phase shift member and phase shift areas were formed to a depth of 138 nm taking the refractive index of $N_2$ which is equal to 1.0 into consideration.

Thereafter, as shown in FIG. 15A, a transparent plate 155 made of a material same as that of the transparent substrate was bonded onto the transparent substrate in an $N_2$ atmosphere. Reference numeral 154 denotes the areas sealed by the plate.

Then, as shown in FIG. 15B, an SiOγ ($1.0<\gamma<1.9$) film was formed to a thickness of 175 nm to produce a translucent phase shift film 156 on the planarized substrate. Subsequently, the SiNγ film was so adjusted that it showed a phase differentiated by 180° from that phase of the areas carrying no SiNγ film and an amplitude transmissivity of 21%.

Then, as shown in FIG. 15C, a resist 157 designed for use with electron beams was applied to the substrate to form a film with a thickness of 500 nm and, thereafter, a conductive film 158 was formed by application of a conductive material to a thickness of 200 nm. Subsequently, the film was exposed to electron beams for alignment with the phase shift patterns and resist patterns 157a were produced by photographically developing the exposed film as shown in FIG. 15D.

Following to this, exposed areas of the SiNγ film were removed to produce translucent phase shift patterns 156a by etching, using the resist patterns as a mask as shown in FIG. 15E. Finally, as shown in FIG. 15F, an exposure mask with an excellent dimensional controllability was produced by peeling off the electron beam resist.

When the mask of this example was exposed to ArF beams, using PMMA resist to a film thickness of 0.2 μm, it showed a depth of focus of 1.4 μm at areas where repeated patterns of 0.20 μm were arranged in a zigzag manner corresponding to the transparent phase shift areas and a depth of focus of 0.3 μm at areas where no phase shift areas were found on in the transparent substrate and isolated patterns of 0.2 μm were constituted solely by translucent phase shift patterns.

While an electron beam resist was used to draw patterns with electron beams for the formation of mask patterns in the above example, mask patterns may alternatively be formed by using a photoresist and beams of light for alignment. Additionally, while quartz was used for a transparent substrate in the above example, a substrate principally composed of $Al_2O_3$, $MgF_2$, or $CaF_2$ may alternatively be used. While $N_2$ was used for the phase shift member in this example, any material having a refractive index different from that of the substrate and an extinction coefficient substantially equal to that of the material constituting the substrate may alternatively be used.

Further, while a same material was used for both the transparent plate and the transparent substrate in the above example, they may be made of materials different from each other. The transparent plate may show a slight extent of light absorption. Still additionally, while an SiNγ was used for the translucent phase shift member of the above example, another material selected from silicon, germanium, gallium arsenide as well as oxides, nitrides, hydrides, carbides, halogenides of various metals such as silicon oxide, titanium oxide, chromium oxide and mixtures of any of these substances having a strictly controlled composition could be used.

As described in detail, according to the invention, there is provided an improved Levenson-type phase shift mask, wherein opaque patterns of a conventional Levenson-type are replaced by translucent phase shift patterns which are used in combination with transparent phase shift patterns to produce finely defined patterns.

The fact that translucent phase shift patterns are partly laid on respective transparent phase shift patterns in an exposure mask according to the invention also serves to provide finely defined patterns.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An exposure mask comprising mask patterns formed on a transparent substrate,
   said mask patterns comprising translucent phase shift patterns having a light path length for at least exposure light differentiated by 180° from that of transparent areas of said transparent substrate and transparent phase shift patterns,
   wherein said mask patterns have areas where said transparent phase shift patterns partly overlap with corresponding translucent phase shift patterns.

2. The exposure mask according to claim 1, wherein said translucent phase shift patterns are made of one selected from the group consisting of silicon, germanium, gallium arsenide, titanium, aluminum, chromium, tin, indium, nickel, cobalt and tantalum as well as their oxides, nitrides, hydrides carbides, halogenides and mixtures of any of these.

3. The exposure mask according to claim 1, wherein said translucent phase shift patterns have an amplitude transmissivity between 10 and 30%.

4. The exposure mark according to claim 1, wherein said transparent phase shift patterns have a transmissivity not lower than 95% for exposure light.

5. The exposure mask according to claim 4, wherein said transparent phase shift patterns are made of one selected from the group consisting of $SiO_2$, $Si_3N_4$, $CaF_2$, $Al_2O_3$ and $MgF_2$.

6. The exposure mask according to claim 1, further comprising an opaque film on areas outside said transparent phase shift patterns and translucent phase shift patterns.

7. The exposure mask according to claim 1, wherein said transparent substrate is made of one selected from the group consisting of quartz, $Si_3N_4$, $Al_2O_3$, $MgF_2$ and $CaF_2$.

8. An exposure mask comprising:
a transparent substrate capable of transmitting exposure light;
transparent phase shift areas formed by burying into said transparent substrate a substance having a refractive index different from that of the transparent substrate relative to exposure light and planarizing the surface of said transparent substrate; and
translucent phase shift patterns on the planarized surface of said transparent substrate in areas covering the boundaries of said transparent phase shift areas.

9. The exposure mask according to claim 8, wherein said transparent phase shift areas are formed by partly engraving the surface of said transparent substrate so that said transparent phase shift areas show a light path length for exposure light differentiated from that of the remaining areas of said transparent substrate.

10. The exposure mask according to claim 9, wherein a transparent plate is arranged on said transparent substrate to close said transparent phase shift areas.

11. The exposure mask according to claim 10, wherein said transparent plate is made of one selected from the group consisting of $SiO_2$, $Si_3N_4$, $Al_2O_3$, $CaF_2$ and $MgF_2$.

12. An exposure mask comprising mask patterns formed on a transparent substrate,
said mask patterns comprising translucent phase shift patterns having a light path length for at least exposure light differentiated by 180° from that of transparent areas of said transparent substrate and transparent phase shift patterns, wherein said transparent phase shift patterns are on areas of corresponding translucent phase shift patterns including edges.

13. The exposure mask according to claim 8, wherein said translucent phase shift patterns are made of one selected from the group consisting of silicon, germanium, gallium arsenide, titanium, aluminum, chromium, tin, indium, nickel, cobalt and tantalum as well as their oxides, nitrides, hydrides, carbides, halogenides and mixtures of any of these.

14. The exposure mask according to claim 12, wherein said translucent phase shift patterns have an amplitude transmissivity between 10 and 30%.

15. The exposure mask according to claim 12, wherein said translucent phase shift patterns have a transmissivity not lower than 95% for exposure light.

16. The exposure mask according to claim 15, wherein said transparent phase shift patterns are made of one selected from the group consisting of $SiO_2$, $Si_3N_4$, $CaF_2$, $Al_2O_3$ and $MgF_2$.

17. The exposure mask according to claim 12, further comprising an opaque film on areas outside said transparent phase shift patterns and translucent phase shift patterns.

18. The exposure mask according to claim 12, wherein said transparent substrate is made of one selected from the group consisting of quartz, $Si_3N_4$, $Al_2O_3$, $MgF_2$ and $CaF_2$.

19. An exposure mask comprising:
translucent phase shift patterns formed on a transparent substrate in areas corresponding to unexposed areas of the substrate and having a light path length for exposure light differentiated by 180° from that of transparent areas of said transparent substrate; and
transparent phase shift patterns selectively on said transparent substrate in areas corresponding to exposure areas of the substrate,
wherein said mask patterns have areas where said transparent phase shift patterns partly overlap with corresponding translucent phase shift patterns.

20. An exposure mask comprising:
translucent phase shift patterns on a transparent substrate in areas corresponding to unexposed areas of the substrate and having a light path length for exposure light differentiated by 180° from that of transparent areas of said transparent substrate; and
transparent phase shift patterns selectively on said transparent substrate in areas corresponding to exposure areas of the substrate,
wherein said translucent phase shift patterns are on areas of corresponding translucent phase shift patterns including edges.

* * * * *

UNITED STATES PATENT AND TRADEMARK OFFICE
CERTIFICATE OF CORRECTION

PATENT NO. : 5,409,789
DATED : April 25, 1995
INVENTOR(S) : Shin-ichi ITO

It is certified that error appears in the above-indentified patent and that said Letters Patent is hereby corrected as shown below:

Claim 2, Column 25, Line 1, after "hybrides" insert --,--.

Signed and Sealed this

Seventeenth Day of October, 1995

BRUCE LEHMAN

Attest:

Attesting Officer     Commissioner of Patents and Trademarks